United States Patent
Yashiki

(10) Patent No.: US 11,537,051 B2
(45) Date of Patent: Dec. 27, 2022

(54) CONTROL APPARATUS AND CONTROL METHOD, EXPOSURE APPARATUS AND EXPOSURE METHOD, DEVICE MANUFACTURING METHOD, DATA GENERATING METHOD AND PROGRAM

(71) Applicant: NIKON CORPORATION, Tokyo (JP)

(72) Inventor: Satoshi Yashiki, Chigasaki (JP)

(73) Assignee: NIKON CORPORATION, Tokyo (JP)

( * ) Notice: Subject to any disclaimer, the term of this patent is extended or adjusted under 35 U.S.C. 154(b) by 31 days.

(21) Appl. No.: 16/493,808

(22) PCT Filed: Mar. 14, 2018

(86) PCT No.: PCT/JP2018/009954
§ 371 (c)(1),
(2) Date: Dec. 23, 2019

(87) PCT Pub. No.: WO2018/168923
PCT Pub. Date: Sep. 20, 2018

(65) Prior Publication Data
US 2020/0257205 A1   Aug. 13, 2020

(30) Foreign Application Priority Data
Mar. 16, 2017  (JP) .............................. JP2017-051187

(51) Int. Cl.
*G03F 7/20* (2006.01)
(52) U.S. Cl.
CPC .......... *G03F 7/7015* (2013.01); *G03F 7/2008* (2013.01); *G03F 7/70283* (2013.01)
(58) Field of Classification Search
CPC ........ G03F 7/20; G03F 7/2008; G03F 7/7015; G03F 7/70283
See application file for complete search history.

(56) References Cited

U.S. PATENT DOCUMENTS 7,184,192 B2 *  2/2007  Sandstrom ............. H04N 1/195
                                              359/290
10,310,387 B2 *  6/2019  Palmer ................ G03F 7/70483
(Continued)

FOREIGN PATENT DOCUMENTS

EP   1 717 640 A2    11/2006
JP   2005-513770 A    5/2005
(Continued)

OTHER PUBLICATIONS

Jun. 12, 2018 International Search Report issued in International Patent Application No. PCT/JP2018/009954.
(Continued)

*Primary Examiner* — Deoram Persaud
(74) *Attorney, Agent, or Firm* — Oliff PLC

(57) ABSTRACT

A control method for a spatial light modulator for an exposure apparatus having a projection optical system having an optical elements a state of each of which is allowed to be changed, the method sets states of optical elements located in a first area to a first distribution in which a first optical element in a first state and a second optical element in a second state are distributed in a first distribution pattern so that one portion of a light from the optical elements located in the first area enters the projection optical system and setting states of optical elements located in a second area to a second distribution in which the first optical element and the second optical element are distributed in a second distribution pattern to reduce a deterioration of the pattern image caused by a light that enters the projection optical system from the first area.

56 Claims, 17 Drawing Sheets

BASIC PATTERN #1
(PATTERN CANDIDATE#1)

BASIC PATTERN #2
(PATTERN CANDIDATE#2)

(56) References Cited

U.S. PATENT DOCUMENTS

| | | |
|---|---|---|
| 2003/0233630 A1 | 12/2003 | Sandstrom et al. |
| 2005/0084766 A1 | 4/2005 | Sandstrom |
| 2005/0153246 A1 | 7/2005 | Eib et al. |
| 2005/0219502 A1 | 10/2005 | Sandstrom et al. |
| 2005/0270515 A1* | 12/2005 | Troost ................ G03F 7/70058 355/69 |
| 2006/0050261 A1 | 3/2006 | Brotsack |
| 2006/0077506 A1 | 4/2006 | Sandstrom |
| 2006/0209314 A1 | 9/2006 | Latypov et al. |
| 2012/0038896 A1* | 2/2012 | Eib .................... G03F 7/70291 355/77 |
| 2013/0222781 A1 | 8/2013 | Watanabe |
| 2013/0278912 A1* | 10/2013 | Owa ........................ G02B 5/09 355/71 |
| 2013/0314683 A1* | 11/2013 | Watanabe ........... G03F 7/70508 355/71 |
| 2014/0320835 A1* | 10/2014 | Fujiwara ................ G01B 11/24 355/77 |
| 2015/0323786 A1 | 11/2015 | Kita |
| 2015/0378262 A1 | 12/2015 | Liu et al. |
| 2016/0085156 A1* | 3/2016 | Markle ............... G03F 7/70358 430/322 |
| 2016/0313646 A1 | 10/2016 | Dinger et al. |

FOREIGN PATENT DOCUMENTS

| | | |
|---|---|---|
| JP | 2006-501525 A | 1/2006 |
| JP | 2006-501687 A | 1/2006 |
| JP | 2007-522671 A | 8/2007 |
| JP | 2008-529090 A | 7/2008 |
| JP | 2016-507787 A | 3/2016 |
| WO | 2006/083685 A2 | 8/2006 |
| WO | 2012/043497 A1 | 4/2012 |

OTHER PUBLICATIONS

Jun. 12, 2018 Written Opinion of the International Searching Authority issued in International Patent Application No. PCT/JP2018/009954.

Dec. 22, 2020 Supplementary European Search Report issued in European Patent Application No. 18 76 7400.7.

Jan. 6, 2021 Office Action issued in Chinese Patent Application No. 201880018566.3.

Jul. 12, 2021 Office Action issued in Chinese Patent Application No. 201880018566.3.

* cited by examiner

BASIC PATTERN #1
(PATTERN CANDIDATE#1)

BASIC PATTERN #2
(PATTERN CANDIDATE#2)

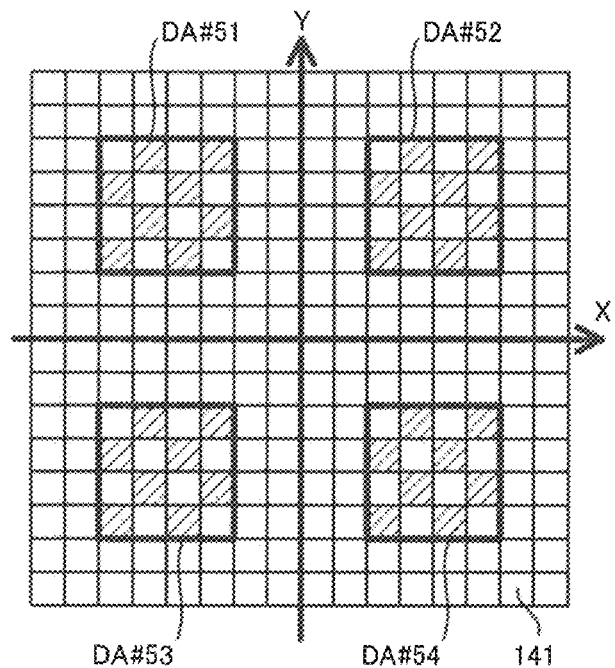 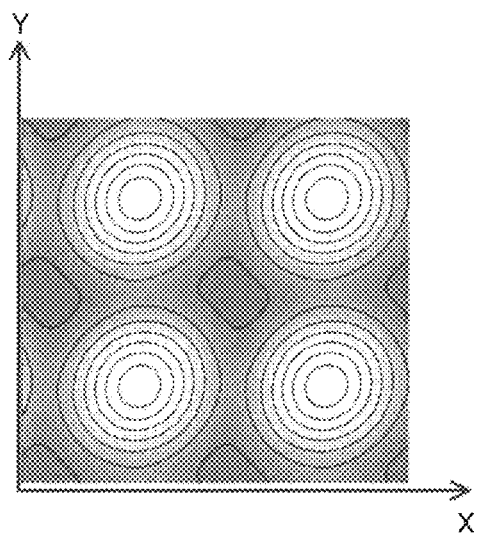
FIG. 15A  FIG. 15B
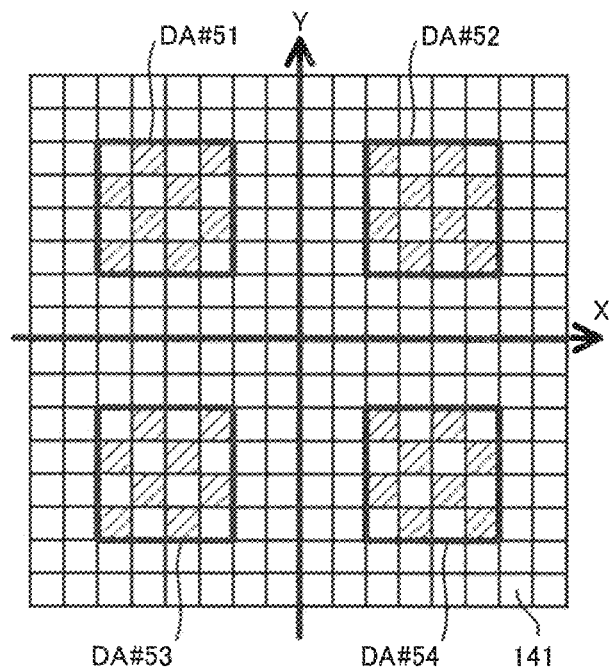 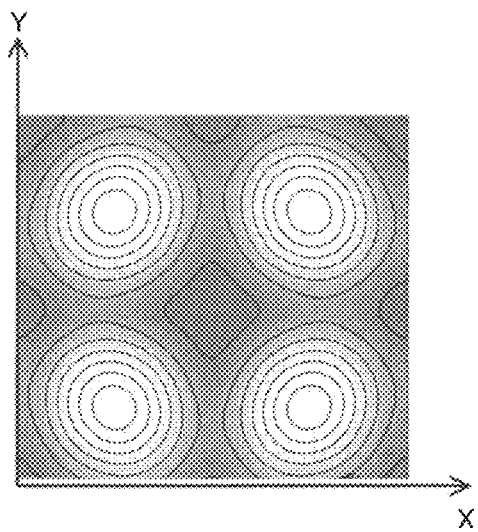
FIG. 16A  FIG. 16B

CONTROL APPARATUS AND CONTROL METHOD, EXPOSURE APPARATUS AND EXPOSURE METHOD, DEVICE MANUFACTURING METHOD, DATA GENERATING METHOD AND PROGRAM

TECHNICAL FIELD

The present invention relates to a control apparatus and a control method for controlling a spatial light modulator used for an exposure apparatus, an exposure apparatus and an exposure method using the control method, a device manufacturing method using the exposure method, a data generating method for generating a control date for controlling a spatial light modulator used for an exposure apparatus, and a program for executing the control method or the data generating method.

BACKGROUND ART

An exposure apparatus that is provided with, instead of a mask, a spatial light modulator (SLM) having a plurality of optical elements (for example, micro mirrors) each of which is allowed to reflect an incident light is proposed (see a Patent Literature 1). Moreover, an exposure apparatus that is provided with a spatial light modulator having a plurality of optical elements (for example, liquid crystal elements) each of which is allowed to transmit an incident light is also proposed (see the Patent Literature 1). A quality of an intensity (for example, a quality of an intensity distribution) of a spatial image formed by a light via the spatial light modulator has a room for improvement.

CITATION LIST

Patent Literature

Patent Literature 1: WO2006/083685A1

SUMMARY OF INVENTION

A first aspect is a control apparatus that is configured to control a spatial light modulator, the spatial light modulator is used for an exposure apparatus having a projection optical system for projecting a pattern image on an object and having a plurality of optical elements a state of each of which is allowed to be changed, the control apparatus is configured to set states of a plurality of optical elements located in a first area to a first distribution in which a first optical element in a first state and a second optical element in a second state that is different from the first state are distributed in a first distribution pattern so that one portion of a light from the plurality of optical elements located in the first area enters the projection optical system, the control apparatus is configured to set states of a plurality of optical elements located in a second area that is adjacent to the first area to a second distribution in which the first optical element and the second optical element are distributed in a second distribution pattern that is different from the first distribution pattern so that a deterioration of the pattern image caused by a light that enters the projection optical system from the first area is reduced.

A second aspect is a control apparatus that is configured to control a spatial light modulator of an exposure apparatus configured to project a pattern image on an object by projecting a light from the spatial light modulator on the object through a projection optical system, the spatial light modulator has a plurality of optical elements a state of each of which is allowed to be changed, the control apparatus is configured to set the states of the plurality of optical elements to reduce an influence on a projection of the pattern image by a light propagating from the spatial light modulator toward an outside of a pupil of the projection optical system.

A third aspect is a control apparatus that is configured to control a spatial light modulator, the spatial light modulator is used for an exposure apparatus configured to transfer a pattern on an object and has a plurality of optical elements a state of each of which is allowed to be changed, the control apparatus is configured to set states of a plurality of optical elements located in a first area to a first distribution in which a first optical element in a first state and a second optical element in a second state that is different from the first state are distributed in a first distribution pattern, the control apparatus is configured to set states of a plurality of optical elements located in a second area that is adjacent to the first area to a second distribution in which the first optical element and the second optical element are distributed in a second distribution pattern that is different from the first distribution pattern.

A fourth aspect is a control apparatus that is configured to control a spatial light modulator having a plurality of optical elements a state of each of which is allowed to be changed, the control apparatus is configured to set states of a plurality of optical elements located in a first area on the spatial light modulator and states of a plurality of optical elements located in a second area that is different from the first area on the spatial light modulator so that a first diffracted light generated from the first area and a second diffracted light generated from the second area weaken each other by interference.

A fifth aspect is a control apparatus that is configured to control a spatial light modulator having a plurality of optical elements a state of each of which is allowed to be changed and that are arranged in a first direction and a second direction that intersects with the first direction, the control apparatus is configured to set a plurality of optical elements located in a first area among the plurality of optical elements of the spatial light modulator so that an optical element in a first state and an optical element in a second state that is different from the first state are arranged on the basis of a first rule, the control apparatus is configured to set a plurality of optical elements located in a second area that is different from the first area among the plurality of optical elements of the spatial light modulator so that the optical element in the first state and the optical element in the second state are arranged on the basis of a second rule that is different from the first rule, when an area in which the optical elements in the first and second states are arranged on the basis of the first rule is expanded to include the second area, the state of an optical element in the area including the second area and the state of an optical element in the second area are different from each other.

A sixth aspect is a control apparatus that is configured to control a spatial light modulator having a plurality of optical elements a state of each of which is allowed to be changed between a first state and a second state and that are arranged along an arrangement plane, the control apparatus is configured to set states of optical elements in a first group among the plurality of optical elements to have a cyclicity in a cyclic direction, the control apparatus is configured to set states of optical elements in a second group that is different from the first group among the plurality of optical elements to have a cyclicity in the cyclic direction, a cycle of the plurality of optical elements in the first group and a cycle of the plurality of optical elements in the second group have different phases in the cyclic direction.

A seventh aspect is a control apparatus that is configured to control a spatial light modulator having a plurality of optical elements a state of each of which is allowed to be changed and that are arranged in a first direction and a second direction that intersects with the first direction, the control apparatus is configured to set states of two optical elements among the plurality of optical elements so that an optical element in a first state and an optical element in a second state that is different from the first state line along a third direction, the control apparatus is configured to set states of different two optical elements that are different from the two optical elements among the plurality of optical elements so that the optical element in the second state and the optical element in the first state line along the third direction, the two optical elements are adjacent to the different two optical elements or an even number of rows of the optical elements are disposed between the two optical elements and the different two optical elements.

A eighth aspect is a control apparatus that is configured to control a spatial light modulator having a plurality of optical elements a state of each of which is allowed to be changed and that are arranged in a first direction and a second direction that intersects with the first direction, the control apparatus is configured to set a state of a first optical element among the plurality of optical elements to a first state, the control apparatus is configured to set a state of a second optical element that is adjacent to a third direction side of the first optical element among the plurality of optical elements to a second state that is different from the first state, the control apparatus is configured to set a state of a third optical element that is different from the first and second optical elements among the plurality of optical elements to the second state, the control apparatus is configured to set a state of a fourth optical element that is adjacent to the third direction side of the third optical element among the plurality of optical elements to the first state, the first optical element and the third optical element are in the same position in the first direction or an odd number of optical elements are disposed between the first optical element and the third optical element in the first direction.

A ninth aspect is a control method of controlling a spatial light modulator, the spatial light modulator is used for an exposure apparatus having a projection optical system for projecting a pattern image on an object and has a plurality of optical elements a state of each of which is allowed to be changed, the control method setting states of a plurality of optical elements located in a first area to a first distribution in which a first optical element in a first state and a second optical element in a second state that is different from the first state are distributed in a first distribution pattern so that one portion of a light from the plurality of optical elements located in the first area enters the projection optical system, the control method setting states of a plurality of optical elements located in a second area that is adjacent to the first area to a second distribution in which the first optical element and the second optical element are distributed in a second distribution pattern that is different from the first distribution pattern so that a deterioration of the pattern image caused by a light that enters the projection optical system from the first area is reduced.

A tenth aspect is a control method of controlling a spatial light modulator of an exposure apparatus configured to project a pattern image on an object by projecting a light from the spatial light modulator having a plurality of optical elements a state of each of which is allowed to be changed on the object through a projection optical system, the control method setting the states of the plurality of optical elements to reduce an influence on a projection of the pattern image by a light propagating from the spatial light modulator toward an outside of a pupil of the projection optical system.

A eleventh aspect is a control method of controlling a spatial light modulator, the spatial light modulator is used for an exposure apparatus configured to transfer a pattern on an object and has a plurality of optical elements a state of each of which is allowed to be changed, the control method setting states of a plurality of optical elements located in a first area to a first distribution in which a first optical element in a first state and a second optical element in a second state that is different from the first state are distributed in a first distribution pattern, the control method setting states of a plurality of optical elements located in a second area that is adjacent to the first area to a second distribution in which the first optical element and the second optical element are distributed in a second distribution pattern that is different from the first distribution pattern.

A twelfth aspect is a control method of controlling a spatial light modulator having a plurality of optical elements a state of each of which is allowed to be changed, the control method setting states of a plurality of optical elements located in a first area on the spatial light modulator and states of a plurality of optical elements located in a second area that is different from the first area on the spatial light modulator so that a first diffracted light generated from the first area and a second diffracted light generated from the second area weaken each other by interference.

A thirteenth aspect is a control method of controlling a spatial light modulator having a plurality of optical elements a state of each of which is allowed to be changed and that are arranged in a first direction and a second direction that intersects with the first direction, the control method includes: setting a plurality of optical elements located in a first area among the plurality of optical elements of the spatial light modulator so that an optical element in a first state and an optical element in a second state that is different from the first state are arranged on the basis of a first rule; and setting a plurality of optical elements located in a second area that is different from the first area among the plurality of optical elements of the spatial light modulator so that the optical element in the first state and the optical element in the second state are arranged on the basis of a second rule that is different from the first rule, when an area in which the optical elements in the first and second states are arranged on the basis of the first rule is expanded to include the second area, the state of an optical element in the area including the second area and the state of an optical element in the second area are different from each other.

A fourteenth aspect is a control method of controlling a spatial light modulator of an exposure apparatus configured to project a pattern image on an object by projecting a light from the spatial light modulator on the object through a projection optical system, the spatial light modulator has a plurality of optical elements a state of each of which is allowed to be changed, the spatial light modulator has the plurality of optical elements the state of each of which is allowed to be changed between a first state and a second state and that are arranged along an arrangement plane, the control method includes: setting states of optical elements in a first group among the plurality of optical elements to have a cyclicity in a cyclic direction; and setting states of optical elements in a second group that is different from the first group among the plurality of optical elements to have a cyclicity in the cyclic direction, a cycle of the plurality of optical elements in the first group and a cycle of the plurality of optical elements in the second group have different phases in the cyclic direction.

A fifteenth aspect is a control method of controlling a spatial light modulator of an exposure apparatus configured to project a pattern image on an object by projecting a light from the spatial light modulator on the object through a projection optical system, the spatial light modulator has a plurality of optical elements a state of each of which is allowed to be changed, the spatial light modulator has the plurality of optical elements the state of each of which is allowed to be changed and that are arranged in a first direction and a second direction that intersects with the first direction, the control method includes: setting states of two optical elements among the plurality of optical elements so that an optical element in a first state and an optical element in a second state that is different from the first state line along a third direction; and setting states of different two optical elements that are different from the two optical elements among the plurality of optical elements so that the optical element in the second state and the optical element in the first state line along the third direction, the two optical elements are adjacent to the different two optical elements or an even number of rows of the optical elements are disposed between the two optical elements and the different two optical elements.

A sixteenth aspect is a control method controlling a spatial light modulator of an exposure apparatus configured to project a pattern image on an object by projecting a light from the spatial light modulator on the object through a projection optical system, the spatial light modulator has a plurality of optical elements a state of each of which is allowed to be changed, the spatial light modulator has the plurality of optical elements the state of each of which is allowed to be changed and that are arranged in a first direction and a second direction that intersects with the first direction, the control method includes: setting a state of a first optical element among the plurality of optical elements to a first state; setting a state of a second optical element that is adjacent to a third direction side of the first optical element among the plurality of optical elements to a second state that is different from the first state; setting a state of a third optical element that is different from the first and second optical elements among the plurality of optical elements to the second state; and setting a state of a fourth optical element that is adjacent to the third direction side of the third optical element among the plurality of optical elements to the first state, the first optical element and the third optical element are in the same position in the first direction or an odd number of optical elements are disposed between the first optical element and the third optical element in the first direction.

A seventeenth aspect is an exposure apparatus having: a spatial light modulator; and a controller configured to control the spatial light modulator, the controller is configured to set state of each of a plurality of optical elements of the spatial light modulator by executing the control method according to any one of the above described ninth to sixteenth aspects.

A eighteenth aspect is an exposure apparatus having: a spatial light modulator; and the control apparatus according to any one of the above described first to eighth aspects for controlling the spatial light modulator.

A nineteenth aspect is an exposure method of transferring a pattern on an object, the exposure method sets states of a plurality of optical elements of the spatial light modulator by using the control method according to any one of the above described ninth to sixteenth aspects and exposes the object by using a light exposure via the spatial light modulator.

A twentieth aspect is an exposure method of transferring a pattern on an object, the exposure method includes: exposing the object by using the exposure apparatus according to the above described eighteenth aspect.

A twenty first aspect is a device manufacturing method of: exposing the object on which a sensitive agent is coated by using the exposure method according to the above described nineteenth or twentieth aspect and transferring a desired patter on the object; developing the exposed sensitive agent and forming an exposure pattern layer corresponding to the desired pattern; and processing the object via the exposure pattern layer.

A twenty second aspect is a data generating method of generating a control data for a spatial light modulator that is used with an exposure apparatus configured to transfer a pattern on an object and that has a plurality of optical elements a state of each of which is allowed to be changed, the data generating method generating, as one portion of the control data, a first set data for setting states of a plurality of optical elements located in a first area to a first distribution in which a first optical element in a first state and a second optical element in a second state that is different from the first state are distributed in a first distribution pattern, the data generating method generating, as one portion of the control data, a second set data for setting states of a plurality of optical elements located in a second area that is adjacent to the first area to a second distribution in which the first optical element and the second optical element are distributed in a second distribution pattern that is different from the first distribution pattern.

A twenty third aspect is a data generating method of generating a control data for a spatial light modulator that is used with an exposure apparatus having a projection optical system for projecting a pattern image on an object and that has a plurality of optical elements a state of each of which is allowed to be changed, the data generating method generating, as one portion of the control data, a set data for setting the states of the plurality of optical elements to reduce an influence on a projection of the pattern by a light propagating from the spatial light modulator toward an outside of a pupil of the projection optical system.

A twenty fourth aspect is a program that allows a controller to execute the control method according to any one of the above described ninth to sixteenth aspects, the controller is connected to the spatial light modulator and is configured to change state of each of the plurality of optical elements.

A twenty fifth aspect is a program that allows a computer to execute the data generating method according to any one of the above described twenty second or twenty third aspect.

An operation and another advantage of the above described aspect will be apparent from an embodiment described below.

BRIEF DESCRIPTION OF DRAWINGS

FIG. 8 Each of FIG. 8A and FIG. 8B is a planar view that illustrates an amplitude component that is obtained by dividing an amplitude distribution of the exposure light EL3 via the mirror elements illustrated in FIG. 7A.

FIG. 15A is a planar view that illustrates four divided areas to which same arrangement pattern is set and FIG. 15B is a graph that illustrates the intensity distribution of the exposure light via the four divided areas illustrated in FIG. 15A.

FIG. 16A is a planar view that illustrates four divided areas in which different arrangement patterns are set to two divided areas that are adjacent to each other in a direction that intersects with each of the X axis direction and the Y axis direction and FIG. 16B is a graph that illustrates the intensity distribution of the exposure light via the four divided areas illustrated in FIG. 16A.

DESCRIPTION OF EMBODIMENTS

Next, with reference to drawings, embodiments of a control apparatus and a control method, an exposure apparatus and an exposure method, a device manufacturing method, a data generating method and a program will be described. However, the present invention is not limited the below described embodiments.

In the below described description, a positional relationship of various components that constitute an exposure apparatus will be described by using an XYZ rectangular coordinate system that is defined by a X axis, a Y axis and a Z axis that are perpendicular to one another. Note that each of an X axis direction and a Y axis direction is assumed to be a horizontal direction (namely, a predetermined direction in a horizontal plane) and a Z axis direction is assumed to be a vertical direction (namely, a direction that is perpendicular to the horizontal plane, and substantially an up-down direction), for the purpose of simple description. Moreover, rotational directions (in other words, inclination directions) around the X axis, the Y axis and the Z axis are referred to as a θX direction, a θY direction and a θZ direction, respectively.

(1) First Embodiment

Figure 1:
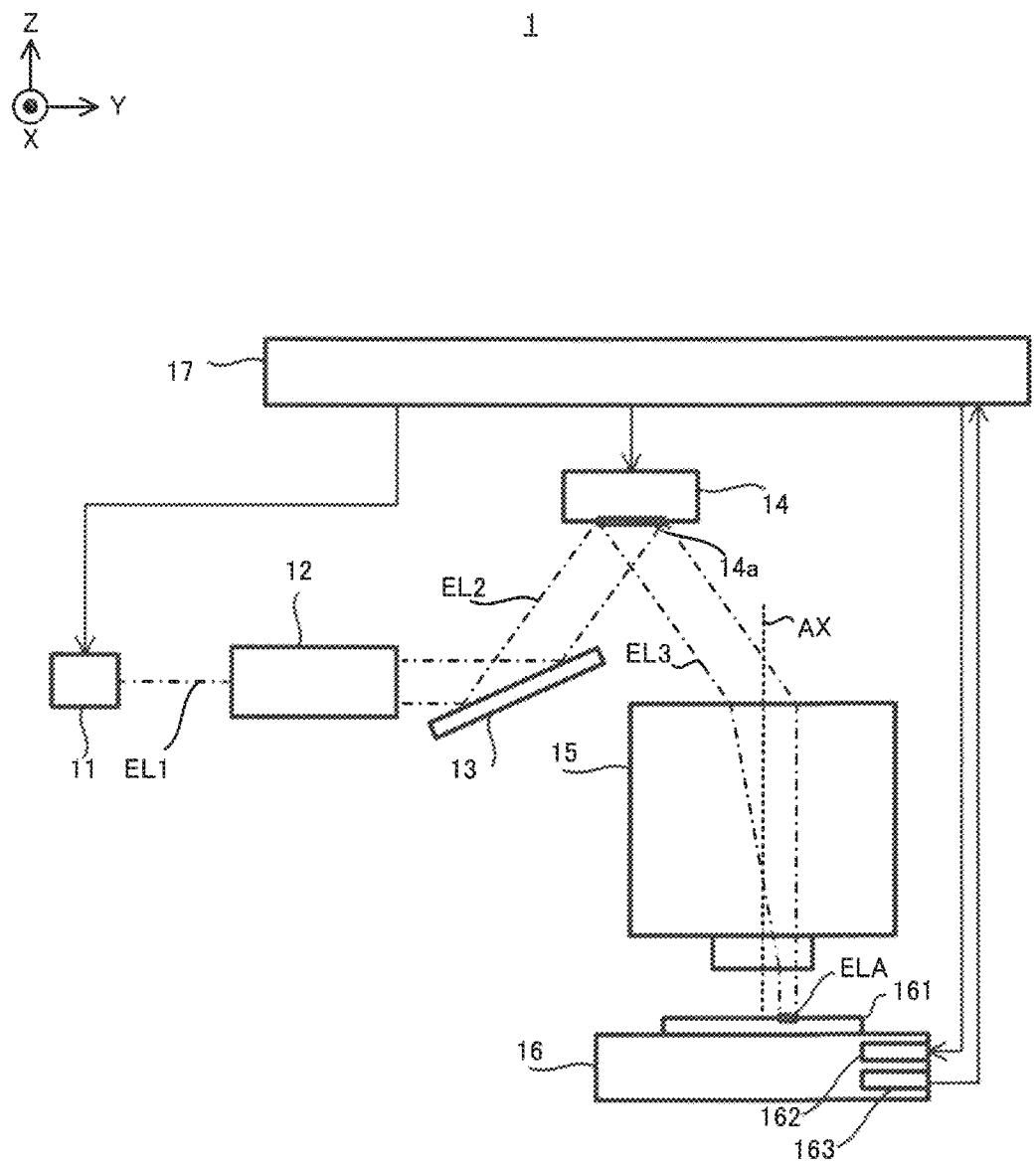
FIG. 1 is a side view that illustrates one example of a structure of an exposure apparatus in the present embodiment.

With reference to FIG. 1 to FIG. 3, an exposure apparatus 1 in the present embodiment will be described.

(1-1) Structure of Exposure Apparatus 1

Firstly, with reference to FIG. 1, a structure of the exposure apparatus 11 in the present embodiment will be described. FIG. 1 is a side view that illustrates one example of the structure of the exposure apparatus 1 in the present embodiment.

As illustrated in FIG. 1, the exposure apparatus 1 is provided with: an optical source 11; an illumination optical system 12, a mirror 13; a spatial light modulator (SLM) 14; a projection optical system 15; a stage 16; and a controller 17.

The optical source 11 is controlled by the controller 17 and configured to emit an exposure light EL1. The light source 11 emits, as the exposure light EL1, a pulse light that repeats ON/OFF in a predetermined frequency. Namely, the light source 11 emits the pulse light that is emitted in a predetermined emitting time (in the below described description, this emitting time is referred to as a "pulse width") in the predetermined frequency. For example, light source 11 may emits the pulse light having the pulse width of 50 ns in a frequency from 4 kHZ to 6 kHz. The exposure light EL1 that is emitted in pulse from the light source 11 may be ArF excimer laser light having a wavelength of 193 nm.

The illumination optical system 12 may be provided with an illuminance uniformization optical system having an optical integrator such as a fly-eye lens and a rod-type of integrator and an illumination field diaphragm (both are not illustrated) as disclosed in US8,792,081B. The illumination optical system 12 uniforms a light amount of the exposure light EL1 from the light source 11 to emit it as an exposure light EL2. A light modulation surface 14a of the spatial light modulator 14 is illuminated by the exposure light EL2. Note that a rectangular illumination area determined by the illumination field diaphragm (a masking system) of the illumination optical system 12 is formed on the light modulation surface 14a of the spatial light modulator.

Note that illumination optical system 12 may include a beam intensity distribution varying part and the like that is configured to vary an intensity distribution of the exposure light EL2 on the light modulation surface 14a.

The mirror 13 deflects the exposure light EL2 outputted from the illumination optical system 12 to guide it to the light modulation surface 14a of the spatial light modulator 14.

The spatial light modulator 14 is provided with a plurality of mirror elements 141 that are arranged two-dimensionally, as described later. Here, a surface at which the plurality of mirror elements 141 are arranged is referred to as the light modulation surface 14a. The exposure light EL2 propagated from the illumination optical system 12 via the mirror 13 is irradiated to the light modulation surface 14a. The light modulation surface 14a is a surface that is parallel to a XY plane and a surface that intersects with a traveling direction of the exposure light EL2. The light modulation surface 14a has a rectangular shape. The exposure light EL2 illuminates the light modulation surface 14a with a substantially uniformed illuminance distribution.

The spatial light modulator 14 reflects, to the projection optical system 15, the exposure light EL2 irradiated to the light modulation surface 14a of the spatial light modulator 14. The spatial light modulator 14 spatially modulates the exposure light EL2 on the basis of a device pattern that should be transferred to the wafer 161 (namely, a pattern image that should be projected on the wafer 161) in reflecting the exposure light EL2. Here, "spatially modulating the light" may means varying a distribution of a light characteristic that is at least one of an amplitude (an intensity) of the light, a phase of the light, a state of a polarization of the light, a wavelength of the light and the traveling direction of the light (in other words, a state of a deflection) at a cross-sectional plane that intersects with the traveling direction of the light. In the present embodiment, the spatial light modulator 14 is a reflective type of spatial light modulator.

Figure 2A:
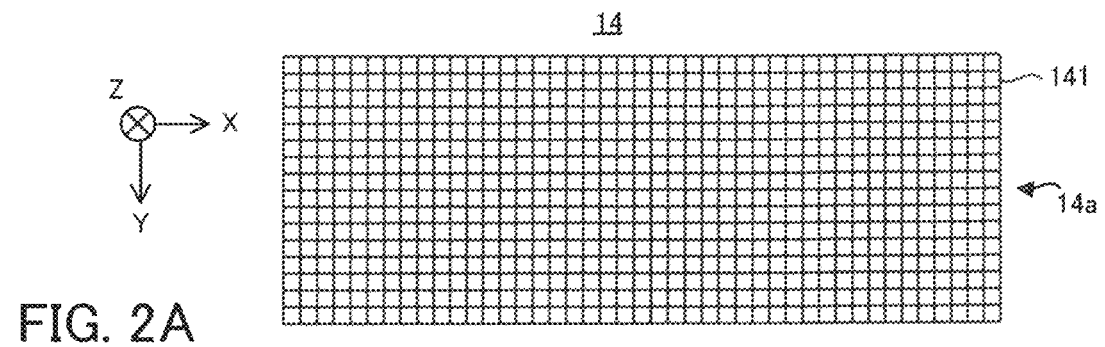
FIG. 2A is a planar view that illustrates a structure of a light modulation surface of a spatial light modulator.
Figure 2B:
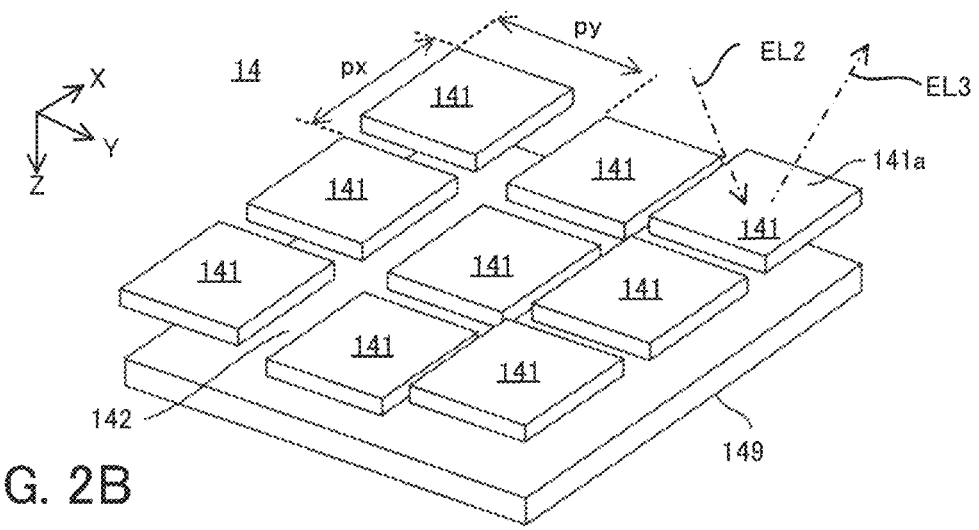
FIG. 2B is a perspective view that illustrates a structure of one portion of the light modulation surface of the spatial light modulator.

Next, with reference to FIG. 2A to FIG. 2D, the spatial light modulator 14 will be described more. As illustrated in FIG. 2A and FIG. 2B, the spatial light modulator 14 is provided with the plurality of mirror elements 141. Note that FIG. 2B is a diagram in which one portion of the plurality of mirror elements 141 illustrated in FIG. 2A are extracted, for the purpose of clear illustration. The plurality of mirror elements 141 are arranged in a two-dimensional array (in other words, in a matrix) on the XY plane that is a plane parallel to the light modulation surface 14a. For example, the number of the arrangement of the plurality of mirror elements 141 in the Y axis direction is several hundreds to several thousands. For example, the number of the arrangement of the plurality of mirror elements 141 in the X axis direction is several times to tens of time of the number of the arrangement of the plurality of mirror elements 141 in the Y axis direction. One example of the number of the arrangement of the plurality of mirror elements 141 in the X axis direction is several hundreds to several tens thousands. The plurality of mirror elements 141 are arranged to be away from each other in the X axis direction by a predetermined arrangement interval px and to be away from each other in the Y axis direction by a predetermined arrangement interval py. One example of the arrangement interval px is 10 micrometers to 1 micrometer, for example. One example of the arrangement interval py is 10 micrometers to 1 micrometer, for example.

Each mirror elements 141 has a square shape (alternatively, any planar shape). Sizes of each mirror element 141 in the X axis direction and the Y axis direction are smaller than the above described arrangement intervals px and py, respectively, because a position and/or an attitude of each mirror element 141 is varied. Namely, a gap 142 that does not constitute the mirror element 141 exists between two mirror elements 141 adjacent to each other in the X axis direction and between two mirror elements 141 adjacent to each other in the Y axis direction. In other words, it is estimated to be technically difficult to manufacture each mirror elements 141 so that the sizes of each mirror element 141 in the X axis direction and the Y axis direction are same as the above described arrangement intervals px and py, respectively (namely, the gap 142 does not exist), considering the variation of the position and/or the attitude of each mirror element 141. However, the size and the shape of each mirror element 141 may be any size and any shape (for example, the sizes of each mirror element 141 in the X axis direction and the Y axis direction may be substantially same as the above described arrangement intervals px and py, respectively).

A surface of each mirror element 141 to which the exposure light EL2 is irradiated is a reflecting surface 141a that reflects the exposure light EL2. A surface located at a −Z direction side among two surface of each mirror element 141 parallel to the XY plane is the reflecting surface 141a. A reflecting film is formed on the reflecting surface 141a, for example. A metal film or a dielectric multifilm may be used as the reflecting film of the reflecting surface 141a, for example. An aggregation of the reflecting surfaces 141a of the plurality of mirror elements 141 is substantially the light modulation surface 14a to which the exposure light EL2 is irradiated.

Figure 2C:
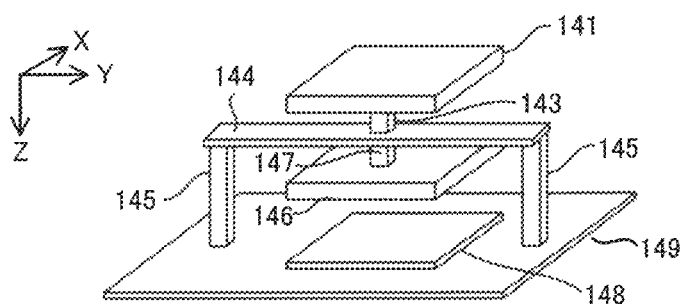
FIG. 2C is a perspective view that illustrates a structure of one mirror element of the spatial light modulator and FIG. 2D is a side view that illustrates two state of the mirror element of the spatial light modulator.
Figure 2D:
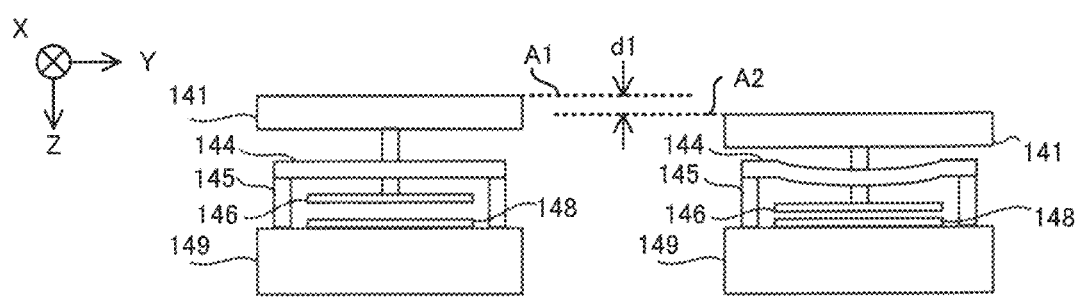

As illustrated in FIG. 2C, each mirror element 141 of the spatial light modulator 14 is connected to a hinge part 144 by a first connecting member 143. The hinge part 144 has a flexibility to bend in the Z axis direction by using an elastic deformation. The hinge part 144 is supported by a pair of post part 145 disposed on a support substrate 149. Moreover, a second connecting member 147 that connects an anchor part 146 that is affected by a electrostatic force (an attracting force or a repulsive force) by a below described electrode 148 and the hinge part 144 is disposed at the hinge part 144. As described above, the anchor part 146 and the mirror element 141 are connected mechanically via the first connecting part 143, the second connecting part 147 and the hinge part 144. And, the electrode 148 is formed on the support substrate 149. Note that the number of the post parts 145 is not limited to one pair and may be a number equal to or larger than 2.

When a predetermined voltage is applied to the electrode 148, the electrostatic force is generated between the anchor part 146 and the electrode 148. As described above, when the electrostatic force is generated between the anchor part 146 and the electrode 148, the anchor part 146 moves toward the support substrate 149 side and this movement allows the mirror element 141 to move toward the support substrate 149 side.

A state of each mirror element 141 is changed between two states between which positions along a direction perpendicular to the reflecting surface 141a (namely, the Z axis direction) are different due to the electrostatic force generated between the anchor part 146 and the electrode 148 and the elastic force of the hinge part 144. For example, as illustrated in a left side of FIG. 2D, when the electrostatic force is not generated between the anchor part 146 and the electrode 148 (namely, when the hinge part 144 does not bend), each mirror element 141 is in a first state in which the reflecting surface 141a of each mirror element 141 is coincident with a reference plane A1. For example, as illustrated in a right side of FIG. 2D, when the electrostatic force is generated between the anchor part 146 and the electrode 148 (namely, when the hinge part 144 bends), each mirror element 141 is in a second state in which the reflecting surface 141a of each mirror element 141 is coincident with a displaced plane A2 that is away from the reference plane A1 toward a +Z direction side by a distance d1.

The reflecting surface 141a of the mirror element 141 in the second state is away from the reflecting surface 141a of the mirror element 141 in the first state toward the +Z direction side by a distance d1. Therefore, a phase of a wave front of an exposure light EL3 that is obtained by the mirror element 141 in the second state reflecting the exposure light EL2 is different from a phase of a wave front of an exposure light EL3 that is obtained by the mirror element 141 in the first state reflecting the exposure light EL2. A difference of this phase corresponds to a length that is twice as long as the distance d1. In the present embodiment, the distance d1 is same as a quarter of the wavelength $\lambda$ of the exposure light EL1. Namely, d1 is represented by an equation of d1=$\lambda$/4+m$\lambda$ (note that m is an integer number). In this case, the phase of the wave front of the exposure light EL3 that is obtained by the mirror element 141 in the second state reflecting the exposure light EL2 is different from the phase of the wave front of the exposure light EL3 that is obtained by the mirror element 141 in the first state reflecting the exposure light EL2 by 180 degree ($\pi$ radian). Namely, the phase of the wave front of the exposure light EL3 via the mirror element 141 in the first state is inverted from the phase of the wave front of the exposure light EL3 via the mirror element 141 in the second state2. Note that the first state is referred to as a "0 state" and the second state is referred to as a "$\pi$ state" in the below described description, for the purpose of clear description.

The spatial light modulator 14 controls the states of the plurality of mirror elements 141 on the basis of the device pattern that should be transferred to the wafer 161 (namely, the pattern image that should be projected on the wafer 161) under the control of the controller 17. Specifically, a pattern design apparatus 2 described later in detail (see FIG. 4A and so on) determines the states of the plurality of mirror elements 141 on the basis of the device pattern that should be transferred to the wafer 161. For example, the pattern design apparatus 2 determines the states of the plurality of mirror elements 141 by determining whether each mirror element 141 is in the 0 state or the $\pi$ state. By this, a phase distribution of the exposure light EL3 reflected by the plurality of mirror elements 141 on a plane perpendicular to (alternatively, intersecting with) the traveling direction of the exposure light EL3 is determined. The controller 17 receives a modulation pattern data that specifies the states of the plurality of mirror elements 141 from the pattern design apparatus 2. The controller 17 controls the states of the plurality of mirror elements 141 on the basis of the modulation pattern data.

Note that one example of the spatial light modulator 14 is disclosed in US2013/0222781A1, for example.

Again in FIG. 1, the projection optical system 15 projects the bright and dark pattern image on the wafer 161 by the exposure light EL3 that is spatially modulated by the spatial light modulator 14. The projection optical system 15 projects the pattern image based on the spatial modulation by the spatial light modulator 14 on the surface of the wafer 161 (specifically, a surface of a resist coating that is coated on the wafer 161) by the exposure light EL3.

The projection optical system 15 projects the exposure light EL3 on a planar exposure area ELA set on the surface of the wafer 161. Namely, the projection optical system 15 projects the exposure light EL3 on the exposure area ELA so that the planar exposure area ELA set on the surface of the wafer 161 is exposed by the exposure light EL3. An optical axis AX of the projection optical system 15 is perpendicular to the planar exposure area ELA. The planar exposure area ELA is formed at a position that is away from the optical axis AX of the projection optical system 15. A predetermined area that is away from a portion at which the optical axis AX of the projection optical system 15 intersects with the surface of the wafer 161 is the planar exposure area ELA.

The projection optical system 15 projects the exposure light EL3 having the phase distribution based on the device pattern as a spatial image having an intensity distribution based on the phase distribution on the surface of the wafer 161.

The projection optical system 15 is a reduction system. In the present embodiment, a projection magnification of the projection optical system 15 is ¹⁄₂₀₀ as one example. A resolution of the projection optical system 15 is set to be larger than a value that is obtained by multiplying the size of each mirror element 141 of the spatial light modulator 14 (the size of one side of each mirror element) by the projection magnification. Therefore, the exposure light EL3 reflected by single mirror element 141 is not resolved on the exposure area ELA. Note that the projection magnification of the projection optical system 15 is not limited to a reduction magnification of ¹⁄₂₀₀ and may be a reduction magnification of ¹⁄₄₀₀ or may be an equal magnification or an enlargement magnification.

The stage 16 is configured to hold the wafer 161 and to release the held wafer 161. The stage 16 is movable along a plane (for example, the XY plane) including the exposure area ELA in a state where the stage 16 holds the wafer 161 under the control of the controller 17. The stage 16 is movable along at least one of the X axis direction, the Y axis direction, the Z axis direction, the $\theta$X direction, the $\theta$Y direction and the $\theta$Z direction. For example, the stage 16 may be moved by an operation of a stage driving system 162 including a planer motor. Note that one example of the stage driving system 162 including the planer motor is disclosed in US6,452,292B. note that the stage driving system 162 may include another motor (for example, a linear motor) in addition to or instead of the planar motor.

A position of the stage 16 on the XY plane (note that a rotational angle along at least one of the $\theta$X direction, the $\theta$Y direction and the OZ direction. may be included) is continuously measured by a laser interferometer 162 with a resolution of 0.25 nanometers. A measured result of the laser interferometer 163 is outputted to the controller 17. Note that the exposure apparatus 1 may be provided with another measurement apparatus (for example, an encoder) that is configured to measure the position of the stage 16 on the XY plane in addition to or instead of the laser interferometer 163.

The controller 17 is configured to control the operation of the exposure apparatus 1. The controller 17 may include a CPU (Central Processing Unit) and a memory, for example. For example, the controller 17 controls an operation of emitting the exposure light EL1 by the optical source 11. Specifically, the controller 17 controls the optical source 11 to emit, as the exposure light EL1, the pulse light that has a predetermined pulse width and that is emitted in pulse in the predetermined frequency at an appropriate timing. Moreover, the controller 17 controls an operation of spatially modulating the exposure light EL2 by the spatial light modulator 14. Specifically, the controller 17 controls the states of the plurality of mirror elements 141 on the basis of the modulation pattern data received from the pattern design apparatus 2. Moreover, the controller 17 controls the movement of the stage 16. Specifically, the controller 17 controls the stage driving system 162 so that the exposure area ELA relatively moves along a desired moving route on the surface of the wafer 161.

Note that the illumination optical system 12 may adjust the exposure light EL1 so that the exposure light EL2 is irradiated to one portion of the light modulation surface 14a. The illumination optical system 12 may adjust the exposure light EL1 so that an illumination area to which the exposure light EL2 is irradiated on the light modulation surface 14a is smaller than the light modulation surface 14a. The illumination optical system 12 may adjust the exposure light EL1 so that a shape of the illumination area to which the exposure light EL1 is irradiated on the light modulation surface 14a is different from a shape of the light modulation surface 14a. For example, the shape of the illumination area to which the exposure light EL2 is irradiated on the light modulation surface 14a may be a polygonal shape (a trapezoidal shape, a parallelogram shape, a hexagonal shape and the like) smaller than the light modulation surface. Moreover, the illumination optical system 12 may vary the intensity distribution of the exposure light EL2 in a beam cross-sectional plane to almost uniform the illuminance distribution of the exposure light EL2 entering the light modulation surface 14a. In this case, the illumination optical system 12 may be provided with a beam intensity distribution varying part that is disposed on an optical path at the emitting side of the optical integrator of the illumination optical system 12. Note that the illumination optical system 12 may vary the intensity distribution of the exposure light EL2 in the beam cross-sectional plane to make the illuminance distribution of the exposure light EL2 entering the light modulation surface 14a be non-uniform, for example, a trapezoidal shape along a direction perpendicular to a scanning direction. Moreover, the illuminance distribution of the exposure light EL2 entering the light modulation surface 14a may be a trapezoidal shape along the scanning direction.

The spatial light modulator 14 may control the intensity distribution of the exposure light EL3 (namely, the intensity distribution on a plane along a direction perpendicular to (alternatively, intersecting with) the traveling direction of the exposure light EL3), in addition to or instead of controlling the phase distribution of the exposure light EL3.

The spatial light modulator 14 in the above described example is a phase type (a piston type) of spatial light modulator having the plurality of mirror elements 141 a position of each of which is variable along a vertical direction (namely, the traveling direction of the exposure light EL2). However, the spatial light modulator 14 may be an inclination type of spatial light modulator having a plurality of mirror elements each of which is allowed to be inclined (for example, inclined to the X axis or the Y axis). The inclination type of spatial light modulator may be a spatial light modulator that adds a phase difference of the reflected light between a reference state in which a reflecting surface is located along an arrangement plane of the mirrors of the spatial light modulator and an inclined state in which the reflecting surface is inclined to the arrangement plane. Moreover, the spatial light modulator 14 may be a phase step inclination type of spatial light modulator in which the reflecting planes of the plurality of mirror elements of the inclination type of spatial light modulator includes stepped surface. The phase step inclination type of spatial light modulator is a spatial light modulator that sets a phase difference between the light reflected by the reflecting surface 141a parallel to the light modulation surface 14a and the light reflected by the reflecting surface 141a inclined to the light modulation surface 14a to $\lambda/2$ (180 degree ($\pi$ radian). Moreover, a spatial light modulator that is provided with a plurality of mirror elements a position of each of which is variable along the vertical direction and a fixed reflecting surface located between the plurality of mirror elements and that is configured to spatially modulate a light intensity by the movement of the mirrors along the vertical direction.

(1-2) Operation of Exposure Apparatus 1

Figure 3A:
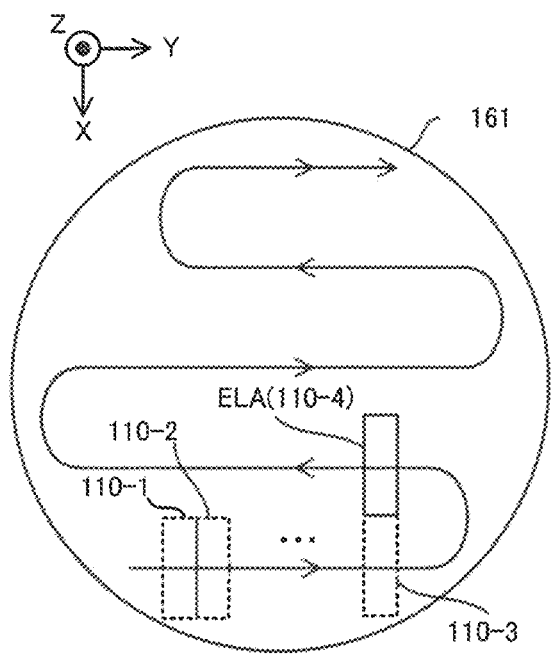
FIG. 3A is a planar view that illustrates one example of a moving route of an exposure area on a surface of a wafer and each of FIG. 3B
Figure 3B:
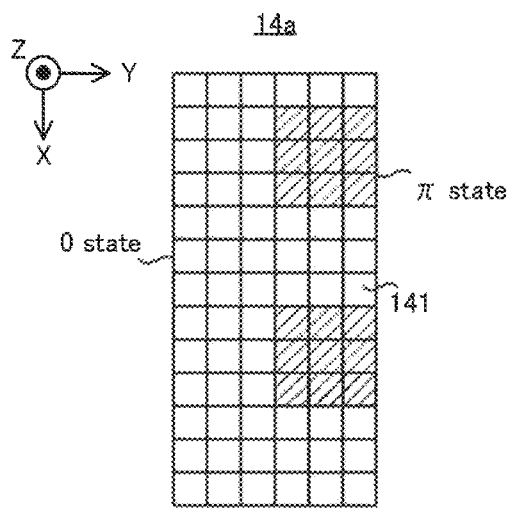
FIG. 3C is a planar view that illustrates one example of states of a plurality of mirror elements.
Figure 3C:
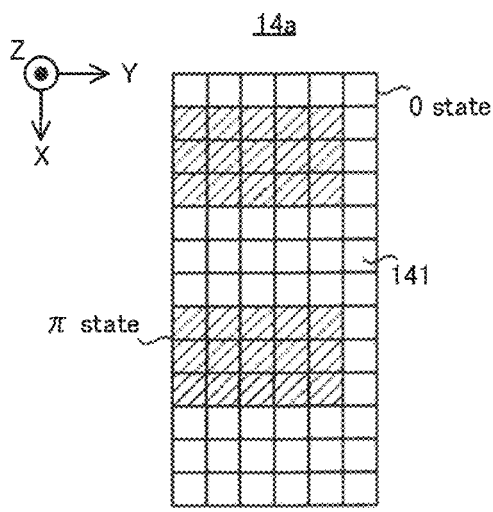

Next, with reference to FIG. 3A to FIG. 3C, an operation (especially, an exposure operation) of the exposure apparatus 1 in the present embodiment will be described. FIG. 3A is a planar view that illustrates one example of the moving route of the exposure area ELA on the surface of the wafer 161 and each of FIG. 3B and FIG. 3C is a planar view that illustrates one example of states of the plurality of mirror elements 141.

Firstly, the exposure apparatus 1 loads the wafer 161. In other words, the wafer 161 (namely, the wafer 161 on which the resist is coated) is mounted on the stage 16. Then, the exposure apparatus 1 exposes the wafer 161.

As illustrated in FIG. 3A, the exposure light EL3 is irradiated on the planar exposure area ELA set on the surface of the wafer 161. The exposure light EL3 exposes the exposure area ELA. The exposure area ELA is exposed by one or more emitted pulse(s) included in the pulse light that is the exposure light EL3. As a result, the exposure light EL3 is irradiated to an exposure target surface 110 that is at least one planar portion of the surface of the wafer 161 and that is overlapped with the exposure area ELA.

The stage 16 is moved so that the exposure area ELA relatively moves along the desired moving route on the surface of the wafer 161. An arrow illustrated in FIG. 3A illustrates one example of the moving route of the exposure area ELA. In an example illustrated in FIG. 3A, the stage 16 is moved toward the −Y direction so that the exposure area ELA moves toward the +Y direction (+scanning direction) at a certain timing. Then, the stage 16 is moved toward the +X direction (+step direction) so that the exposure area ELA moves toward the −X direction. Then, the stage 16 is moved toward the +Y direction so that the exposure area ELA moves toward the −Y direction (−scanning direction). Then, the stage 16 is moved toward the +X direction so that the exposure area ELA moves toward the −X direction (−step direction). Then, the stage 16 repeats the movement toward the −Y direction, the movement toward the +X direction, the movement toward the +Y direction and the movement toward the +X direction. As a result, the exposure area ELA relatively moves along the route illustrated by the arrow in FIG. 3A on the surface of the wafer 161. Note that this exposure method is disclosed US8,089,616B, for example.

The surface of the wafer 161 is allowed to be divided into a plurality of exposure target surfaces 110. In which case, the stage 16 is moved so that the exposure area ELA is overlapped with the plurality of exposure target surface 110 in order. The stage 16 is moved so that the exposure area ELA traces the plurality of exposure target surface 110 in order. In the example illustrated in FIG. 3A, the stage 16 is moved toward the −Y direction so that the exposure area ELA is overlapped with an exposure target surface 110-1. The optical source 11 emits the exposure light EL1 so that the exposure light EL3 exposes the exposure area ELA (namely, the exposure target surface 110-1) at a timing when the exposure area ELA is overlapped with the exposure target surface 110-1. Namely, the optical source 11 emits the exposure light EL3 so that the timing when the exposure area ELA is overlapped with the exposure target surface 110-1 is same as a timing of one emitted pulse included in the pulse light emitted from the optical source 11. Then, the stage 16 is moved toward the −Y direction so that the exposure area ELA is overlapped with an exposure target surface 110-2 that is adjacent to the exposure target surface 110-1 along the Y axis direction. The optical source 11 does not emit the exposure light EL1 during a period when the exposure area ELA is moved from the exposure target surface 110-1 to the exposure target surface 110-2. Namely, the pulse is not emitted during the period when the exposure area ELA is moved from the exposure target surface 110-1 to the exposure target surface 110-2. The optical source 11 emits the exposure light EL1 so that the exposure light EL3 exposes the exposure area ELA (namely, the exposure target surface 110-2) at a timing when the exposure area ELA is overlapped with the exposure target surface 110-2. Then, same operation is repeatedly executed on a series of exposure target surfaces 110 that are arranged along the Y axis direction. Then, when the exposure to the series of exposure target surfaces that are arranged along the Y axis direction is completed (namely, the exposure to an exposure target surface 110-3 is completed), the stage 16 is moved toward the −X direction so that the exposure area ELA is overlapped with an exposure target surface 110-4 that is adjacent to the exposure target surface 110-3 along the X axis direction. Then, same operation is repeatedly executed on a series of exposure target surfaces 110 that are arranged along the Y axis direction with the exposure target surface 110-4 being a start position. Then, the above described operation is repeated so that the exposure target surface ELA moves along the moving route illustrated in FIG. 3A.

Note that one exposure target surface 110 is not overlapped with adjacent another exposure target surface 110 for the purpose of simple illustration in the example illustrated in FIG. 3A. Namely, one portion of one exposure target surface 110 is not overlapped with one portion of the adjacent another exposure target surface 110. However, one portion of one exposure target surface 110 may be overlapped with one portion of the adjacent another exposure target surface 110. For example, one portion of one exposure target surface 110 may be exposed by one emitted pulse and one portion of the adjacent another exposure target surface 110 that is overlapped with one portion of one exposure target surface 110 may be exposed by one emitted pulse.

Moreover, in the example illustrated in FIG. 3A, the wafer 161 is exposed by one or more emitted pulse(s) during a period when the exposure area ELA relatively moves along the desired moving route on the surface of the wafer 161. However, the exposure area ELA may stop on the wafer 161 at a timing when the wafer 161 is exposed. In this case, the exposure apparatus 1 executes an operation of moving the exposure area ELA on the surface of the wafer 161 after exposing the exposure target surface 110. Moreover, when the wafer 161 is exposed in a state where the exposure area ELA stops to the wafer 161 as described above, the exposure apparatus 1 may execute the exposure by the plurality of emitted pulses instead of the exposure by single emitted pulse.

The plurality of mirror elements 141 of the spatial light modulator 14 change to states based on the device pattern that should be transferred to the wafer 161 by the exposure using single emitted pulse for every exposure (namely, one emitted pulse). Namely, the plurality of mirror elements 141 change to the states of the plurality of mirror elements 141 that are for executing the exposure by single emitted pulse and that are specified by the modulation pattern data. In other words, the plurality of mirror elements 141 change to the states based on a data block of the modulation pattern data corresponding to the device pattern that should be transferred to the exposure target surface 110 by single emitted pulse.

In the example illustrated in FIG. 3A, when the exposure target surface 110-1 is exposed, the plurality of mirror elements 141 change to states based on the device pattern that should be transferred to the wafer 161 by the exposure to the exposure target surface 110-1 (namely, the device pattern that should be transferred to the wafer 161 located under the exposure target surface 110-1). Then, when the exposure target surface 110-2 is exposed following the exposure target surface 110-1, the plurality of mirror elements 141 change to states based on the device pattern that should be transferred to the wafer 161 by the exposure to the exposure target surface 110-2 (namely, the device pattern that should be transferred to the wafer 161 located under the exposure target surface 110-2). For example, FIG. 3B illustrates one example of the states of the plurality of mirror elements 141 for exposing the exposure target surface 110-1. For example, FIG. 3C illustrates one example of the states of the plurality of mirror elements 141 for exposing the exposure target surface 110-2.

Note that the mirror element 141 that is illustrated by a white area in FIG. 3B and FIG. 3C represents the mirror element 141 in the 0 state. On the other hand, the mirror element 141 that is illustrated by a hatched area in FIG. 3B and FIG. 3C represents the mirror element 141 in the it state.

After the wafer 161 is exposed as described above, the wafer 161 is developed by a not-illustrated developer. Then, the wafer 161 is etched by a not-illustrated etching apparatus. As a result, the device pattern is transferred (in other words, formed) on the wafer 161.

(2) Pattern Design Apparatus 2

Next, with reference to FIG. 4A to FIG. 17B, the pattern design apparatus 2 that generates the modulation pattern data specifying the states of the plurality of mirror elements 141 (namely, a control data for controlling the spatial light modulator 14) will be described.

(2-1) Structure of Pattern Design Apparatus 2

Firstly, with reference to FIG. 4A to FIG. 4C, a structure of the pattern design apparatus 2 will be described. FIG. 4 is a block diagram that illustrates the structure of the pattern design apparatus 2.

Figure 4A:
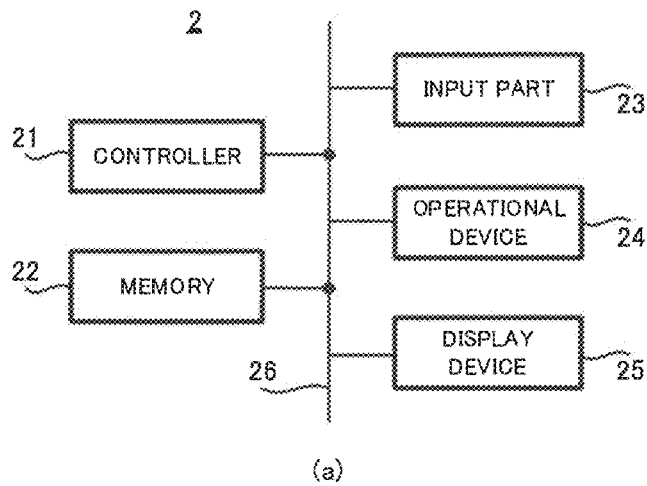
FIG. 4A is a block diagram that illustrates a structure of a pattern design apparatus and each of FIG. 4B

As illustrated in FIG. 4A, the pattern design apparatus 2 is provided with a controller 21, a memory 22, an input part 23, an operational device 24 and a display device 25.

Figure 4B:
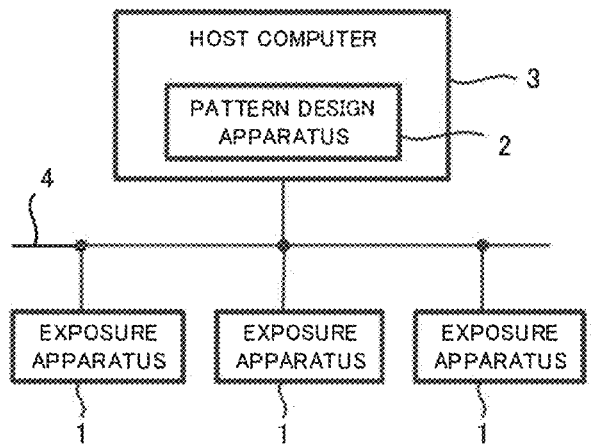
FIG. 4C is a block diagram that illustrates one example of an installed position of the pattern design apparatus.

Here, as illustrated in FIG. 4B, the pattern design apparatus 2 may be installed in a host computer 3 that is connected to the plurality of exposure apparatuses via a wired or wireless communication interface 4 to overall control the plurality of exposure apparatuses 1. The host computer 3 may be disposed in a device manufacturing factory in which the exposure apparatus 1 is installed or outside the device manufacturing factory. A device manufacturing maker has the host computer 3, for example.

Figure 4C:
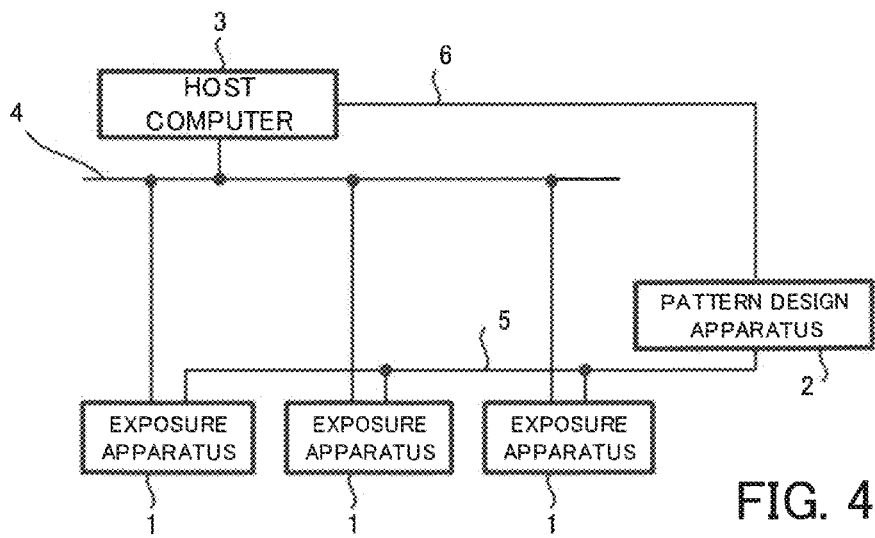

Moreover, as illustrated in FIG. 4C, the pattern design apparatus 2 may be installed in a server that is connected to the plurality of exposure apparatuses via a wired or wireless communication interface 5. And, the pattern design apparatus 2 may be connected to the host computer 3 via a wired or wireless communication interface 6. In the case of FIG. 4C, the pattern design apparatus 2 may be disposed in the device manufacturing factory in which the exposure apparatus 1 is installed or outside the device manufacturing factory.

The controller 21 is configured to control an operation of the pattern design apparatus 2. Especially, the controller 21 generates the modulation pattern data as described later in detail. Specifically, the controller 21 adjusts a design variable that defines a predetermined cost function so that end condition of the cost function (in other words, an objective function) is satisfied. Namely, the controller 21 solves an optimization problem or a mathematical programming problem for optimizing the design variable. As a result, the controller 21 generates the modulation pattern data on the basis of the optimized design variable. Note that the "optimization of the design variable" here means an operation of calculating the design variable that specifies the exposure operation allowing the device pattern to be transferred to the wafer 161 with more better characteristic.

At least one portion of the design variable directly or indirectly specifies the states of the plurality of mirror elements 141, as described later in detail. Thus, the controller 21 generates the modulation pattern data that specifies the states of the plurality of mirror elements 14 by adjusting the design variable that defines the cost function. Namely, the controller 21 generates the modulation pattern data by optimizing the design variable.

The controller 21 serves as an EDA (Electronic Design Automation) tool. Thus, the controller 21 may serve as the EDA tool by executing a computer program that allows the controller 21 to execute an operation of adjusting the design variable (especially, a pattern designing operation) described above.

The memory 22 is configured to store the computer program that allows the controller 21 to execute a process of generating the modulation pattern data described above. Moreover, the memory 22 is configured to store a temporary data generated when the controller 21 executes the above described process of generating the modulation pattern data.

The input part 23 is configured to receive an input of various data used by the controller 21 to execute the process of generating the modulation pattern data. A data representing the device pattern that should be transferred to the wafer 161, a data representing an initial value of the design variable, a data representing a constraint condition of the design variable and the like are examples of this data. However, the pattern design apparatus 2 may not be provided with the input part 23.

The operational device 24 is configured to receive a user's operation to the pattern design apparatus 2. The operational device 24 may include at least one of a keyboard, a mouse and a touch panel, for example. The controller 21 may execute the above described process of generating the modulation pattern data on the basis of the user's operation received by the operational device 24. However, the pattern design apparatus 2 may not be provided with the operational device 24.

The display device 25 is configured to display desired information. For example, the display device 25 may directly or indirectly display information indicating a state of the pattern design apparatus 2. For example, the display device 25 may directly or indirectly display the modulation pattern data generated by the pattern design apparatus 2. For example, the display device 25 may directly or indirectly display any information relating to the above described process of generating the modulation pattern data. However, the pattern design apparatus 2 may not be provided with the display device 25.

Note that the pattern design apparatus 2 may be an apparatus that constitutes one portion of the controller 17 of the exposure apparatus 1. Namely, the pattern design apparatus 2 may be an apparatus that constitutes one portion of the exposure apparatus 1. In this case, the controller 17 generates the modulation pattern data and controls the spatial light modulator 14 on the basis of the generated modulation pattern data.

(2-2) Process of Generating Modulation Pattern Date Executed by Pattern Design Apparatus Next, with reference to a flowchart in FIG. 5, the process of generating the modulation pattern data executed by the pattern design apparatus 2 will be described.

Figure 5:
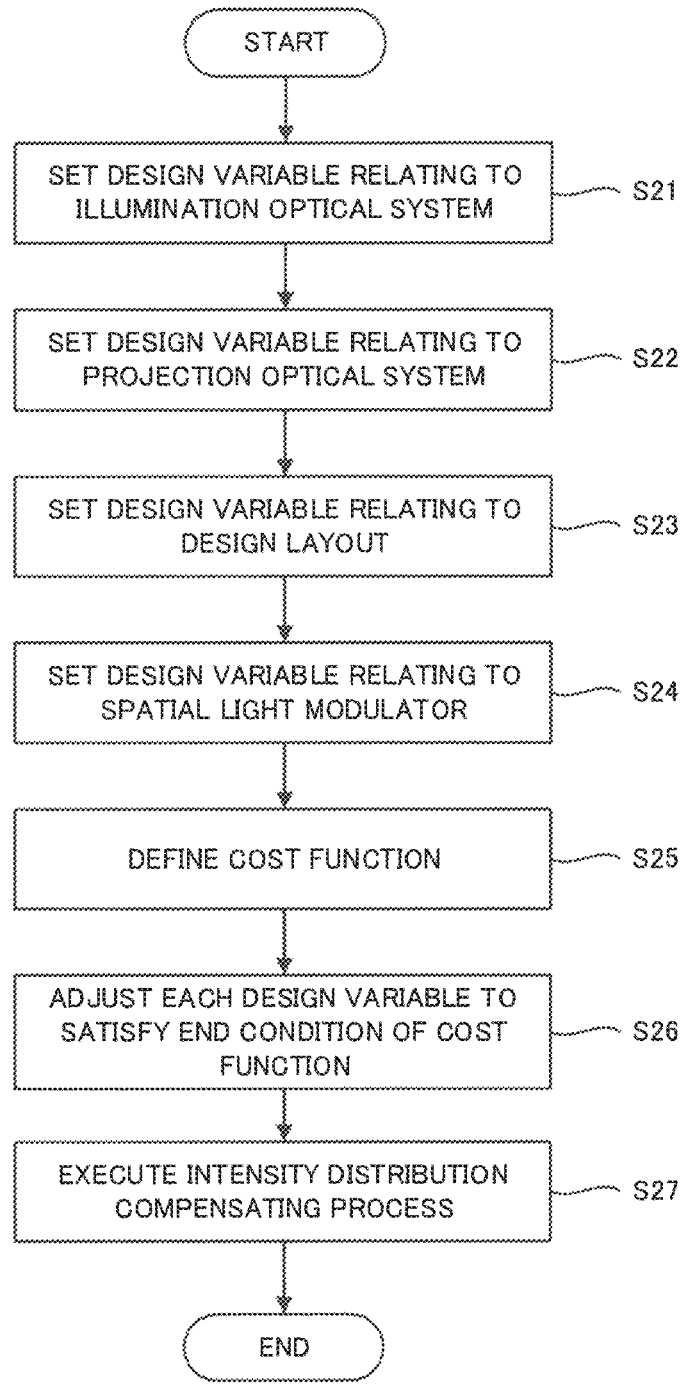
FIG. 5 is a flowchart that illustrates a flow of a pattern design operation executed by the pattern design apparatus.

As illustrated in FIG. 5, the controller 21 sets the design variable relating to the illumination optical system 12 (a step S21). The design variable relating to the illumination optical system 12 is an adjustable or fixed parameter that specifies a characteristic of the optical source 11 (for example, a light intensity distribution at the light modulation surface 14a, a distribution of the polarization of the light at the light modulation surface 14a, a light intensity distribution at a pupil plane of the illumination optical system 12, a distribution of the polarization of the light at the pupil plane of the illumination optical system 12 and the like). At least one of a shape of an illumination pattern of the optical source 11 (namely, a shape of an emitting pattern of the exposure light EL1), the light intensity of the exposure light EL1 and the like is one example of this design variable relating to the optical source 11.

Moreover, the controller 21 sets the design variable relating to the projection optical system 15 (a step S22). The design variable relating to the projection optical system 15 is an adjustable or fixed parameter that specifies a characteristic (for example, an optical characteristic such as an aberration and a retardation) of the projection optical system 15. At least one of a shape of a wave front of the exposure light EL3 projected by the projection optical system 15, the intensity distribution of the exposure light EL3 projected by the projection optical system 15, a phase shift amount of the exposure light EL3 projected by the projection optical system 15 and the like is one example of this design variable relating to the projection optical system 15. Alternatively, when the projection optical system 15 is provided with a wave front manipulator that is configured to adjust at least one of the shape of the wave front of the exposure light EL3, the intensity of the exposure light EL3, the phase shift amount of the exposure light EL3 and the like, a controlled amount (alternatively, a state) of the wave front manipulator is one example of the design variable relating to this projection optical system 15.

Moreover, the controller 21 sets the design variable relating to a design layout (a step S23). The design variable relating to the design layout is an adjustable or fixed parameter that specifies a characteristic (for example, an optical characteristic) of the design layout (namely, a physical or virtual mask pattern used to transfer the desired device pattern to the wafer 161 or the desired device pattern itself). The design layout is generated by what we call the EDA on the basis of the device pattern that should be transferred to the wafer 161 and a predetermined design rule. A minimum width of a line or a hole and a minimum space between two lines or two holes are examples of the predetermined design rule.

Note that one example of the design variable relating to the illumination optical system 12, the design variable relating to the projection optical system 15 and design variable relating to the design layout is disclosed in the above described Patent Literature 1 (WO2006/083685A1) and the like. Thus, the detailed description about these design variables will be omitted for the purpose of simple description.

Moreover, the controller 21 sets the design variable relating to spatial light modulator 14 (a step S24). The design variable relating to the spatial light modulator 14 is an adjustable or fixed parameter that specifies a characteristic (for example, an optical characteristic) of the spatial light modulator 14. An optical characteristic of each mirror element 141 of the spatial light modulator 14 is one example of the design variable relating to spatial light modulator 14. Note that each mirror element 141 is set to be in the first state (the 0 state) or the second state (the it state) as described above. Thus, the design variable relating to spatial light modulator 14 is substantially a design variable that represents the state of each mirror element 141 (alternatively, a distribution of the mirror element 141 in the 0 state and a distribution of the mirror element 141 in the it state).

In addition to the operation from the step S21 to the step S24, the controller 21 may set the constraint condition of each design variable. Moreover, the controller 21 may receive various data used by the controller 21 to generate the modulation pattern data via the input part 23. Set constraint condition and various data received via the input part 23 may be used when the design variable is adjusted described below.

Then, the controller 21 defines a cost function CF specified by the design variables set at the step S21 to the step S24 (a step S25). One example of the cost function CF is represented by an equation 1, for example.

$$CF = \sum_{p=1}^{P} w_p f_p^2(z1_1, \ldots, z1_{N1}, z2_1, \ldots, z2_{N2}, z3_1, \ldots, z3_{N3}, z4_1, \ldots, z4_{N4}) \quad \text{[Equation 1]}$$

Here, "$(z1_1, \ldots, z1_{N1})$" represents the design variable(s) relating to the optical source 11 set at the step S21. "N1" represents a total number of the design variable(s) relating to the optical source 11. "$(z2_1, \ldots, z2_{N2})$" represents the design variable(s) relating to the projection optical system 15 set at the step S22. "N2" represents a total number of the design variable(s) relating to the projection optical system 15. "$(z3_1, \ldots, z3_{N3})$" represents the design variable(s) relating to the design layout set at the step S23. "N3" represents a total number of the design variable(s) relating to the design layout. "$(z4_1, \ldots, z4_{N4})$" represents the design variable(s) relating to the spatial light modulator 14 set at the step S24. "N4" represents a total number of the design variable(s) relating to the spatial light modulator 14. "$f_p(z1_1, \ldots, z1_{N1}, z2_1, \ldots, z2_{N2}, z3_1, \ldots, z3_{N3}, z4_1, \ldots, z4_{N4})$" is a function for calculating a difference between an estimated value of characteristics realized by the design variables $(z1_1, \ldots, z1_{N1}, z2_1, \ldots, z2_{N2}, z3_1, \ldots, z3_{N3}, z4_1, \ldots, z4_{N4})$ at a p-th evaluation point (for example, an evaluation point corresponding to a desired image part of the spatial image (namely, the intensity distribution of the exposure light EL3) on the wafer 161 or a resist image determined by the spatial image) and a target value of the characteristics that should be realized at the p-th evaluation point. "$w_p$" is a weighting coefficient assigned to the p-th evaluation point. "P" is a total number of the evaluation point.

Note that the cost function CF represented by the equation 1 is merely one example. Therefore, the cost function CF that is different from the equation 1 may be defined. Another example of the cost function CF is disclosed in the above described Patent Literature 1 (WO2006/083685A1) and so on, and thus the detailed description about it is omitted.

Then, the controller 21 adjusts (in other words, varies) at least one of the design variables set at the step S21 to the step S24 so that the end condition of the cost function CF is satisfied (a step S26). For example, the controller 21 adjusts at least one design variable so that the end condition that "the cost function CF is minimized" is satisfied. As a result, the values of the design variables that satisfy the end condition of the cost function CF are determined. Here, when the design variable relating to the spatial light modulator 14 is determined, states of the plurality of mirror elements 141 are determined. Thus, the controller 21 generates the modulation pattern data specifying the distribution of the states of the plurality of mirror elements 141 on the basis of the design variable relating to the spatial light modulator 14.

After the modulation pattern data is generated, the controller 21 furthermore executes an intensity distribution compensating process on the generated modulation pattern data (a step S27). The intensity distribution compensating process is a process for reducing a difference between an actual intensity distribution on the wafer 161 of the exposure light EL3 via the spatial light modulator 14 that is controlled on the basis of the modulation pattern data generated at the step S26 and an ideal intensity distribution of the exposure light EL3 (namely, a distortion of the actual intensity distribution to the ideal intensity distribution). In other words, the intensity distribution compensating process is a process for correcting (in other words, adjusting or varying) the modulation pattern data so that the actual intensity distribution of the exposure light EL3 based on the modulation pattern data is closer to the ideal intensity distribution. Note that the intensity distribution compensating process will be described later in detail (see FIG. 6 and so on).

The modulation pattern data generated by the controller 21 executing the above described processes is the modulation pattern data corresponding to all device pattern that should be transferred to the wafer 161. However, the modulation pattern data generated by the controller 21 may be the modulation pattern data corresponding to one portion of the device pattern that should be transferred to the wafer 161. On the other hand, the plurality of mirror elements 141 change to states based on the device pattern that should be transferred to a certain exposure target surface 110 by the exposure using single emitted pulse for every exposure (namely, one emitted pulse), as described above. Thus, the controller 21 extracts, from the modulation pattern data, the data block corresponding to the device pattern that should be transferred to a certain exposure target surface 110 by the single emitted pulse. Then, the controller 17 controls the states of the plurality of mirror elements 141 on the basis of the extracted data block. As a result, the exposure target surface 110 corresponding to this data block is exposed. The controller 21 repeats the above described operation by the number of the exposed target surfaces 110 set on the wafer 161.

(2-3) Intensity Distribution Compensating Process

Next, the intensity distribution compensating process executed by the pattern design apparatus 2 will be described.

(2-3-1) Distortion of Intensity Distribution Compensating Process

Firstly, with reference to FIG. 6A to FIG. 6B, "the difference between the actual intensity distribution of the exposure light EL3 and the ideal intensity distribution of the exposure light EL3 (namely, the distortion of the actual intensity distribution to the ideal intensity distribution)" will be described, as a premise for the intensity distribution compensating process. In the below described description, a device pattern that is used to form a single contact hole is used as one example of the device pattern to describe the intensity distribution of the exposure light EL3 for transferring this device pattern on the wafer 161.

Figures 6A, 6B:
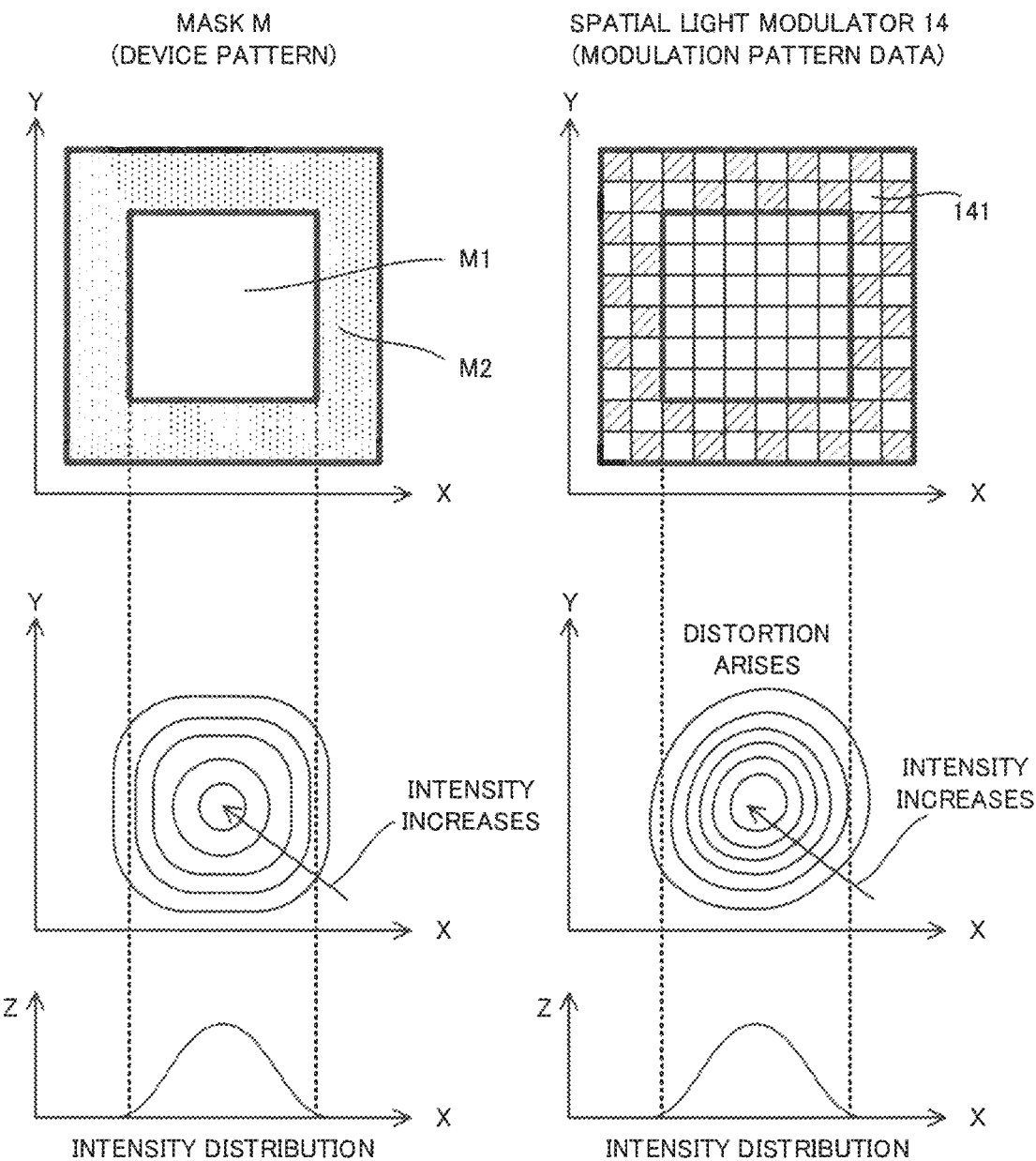
FIG. 6A is a graph that illustrates an intensity distribution of an exposure light via a mask with the mask and FIG. 6B is a graph that illustrates an intensity distribution of the exposure light via the spatial light modulator with the states of the mirror elements.

An upper part of FIG. 6A is a planar view that illustrates a mask M at which the device pattern used to form the single contact hole is formed. As illustrated in the upper part of FIG. 6A, this mask M includes an opening part M1 through which the exposure light is allowed to pass and a light shielding part M2 that shields the exposure light. The intensity distribution of the exposure light projected on the wafer 161 through this mask M is illustrated in a lower part of FIG. 6A. As illustrated in the lower part of FIG. 6B, the intensity distribution of the exposure light in an area on the wafer 161 corresponding to the opening part M1 is the intensity distribution in which the intensity of the exposure light in each area part increases more as each area part is closer to an area corresponding to a center of the opening part M1. The intensity of the exposure light in an area on the wafer 161 corresponding to the light shielding part M2 is nearly zero (alternatively, is equal to or smaller than a predetermined intensity). Moreover, the intensity distribution of the exposure light is the distribution that is symmetric about the area corresponding to the center of the opening part M1 (namely, a center of the contact hole) and that is based on the contact hole that should be formed. The intensity distribution illustrated in FIG. 6A corresponds to the ideal intensity distribution.

On the other hand, an upper part of FIG. 6B illustrates the mirror elements 141 that are controlled to form the single contact hole. Namely, the upper part of FIG. 6B illustrates the mirror elements 141 that are controlled on the basis of the modulation pattern data generated when the device pattern illustrated in the upper part of FIG. 6A is inputted as the design variable relating to the design layout. As illustrated in the upper part of FIG. 6B, the modulation pattern data sets the states of all mirror elements 141 corresponding to the opening part M1 to the 0 state (alternatively, the it state). Moreover, the modulation pattern data sets the states of all mirror elements 141 corresponding to the light shielding part M2 to a state in which the mirror element 141 in the 0 state (it is referred to as a "mirror element 141(0)" in the below described description) and the mirror element 141 in the it state (it is referred to as a "mirror element 141($\pi$)" in the below described description) are alternately distributed (namely, line) along each of the X direction and the Y direction. Note that the mirror element 141 that is illustrated by the white area represents the mirror element 141(0) and the mirror element 141 that is illustrated by the hatched area represents the mirror element 141($\pi$) in FIG. 6B, as with FIG. 3B and FIG. 3C. The same applies to each drawing described below.

The intensity distribution of the exposure light EL3 projected on the wafer 161 through these mirror elements 141 is illustrated in a lower part of FIG. 6B. The intensity of the exposure light EL3 via the plurality of mirror elements 141 corresponding to the opening part M1 is relatively large (for example, is equal to or larger than the predetermined intensity). On the other hand, the intensity of the exposure light EL3 via the plurality of mirror elements 141 corresponding to the light shielding part M2 is nearly zero (alternatively, is equal to or smaller than the predetermined intensity). This is because the exposure light EL3 via the mirror element 141(0) and the exposure light EL3 via the mirror element 141($\pi$) cancel each other. As a result, the intensity distribution of the exposure light EL3 projected on the wafer 161 through the mirror elements 141 substantially approximates the intensity distribution of the exposure light projected on the wafer 161 through the mask M. However, as illustrated in the lower part of FIG. 6B, the intensity distribution of the exposure light EL3 projected on the wafer 161 through the mirror elements 141 is distorted to the ideal intensity distribution illustrated in FIG. 6A (namely, the intensity distribution of the exposure light projected on the wafer 161 through the mask M). As a result, there is a possibility that a shape of the contact hole formed by the exposure light EL3 through the mirror elements 141 is distorted to an ideal shape of the contact hole.

Figure 7A:
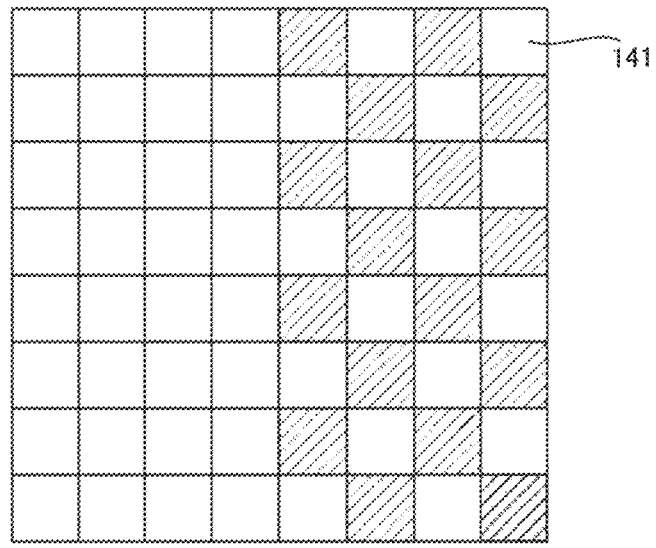
FIG. 7A is a planar view that illustrates one portion of the mirror elements corresponding to a neighborhood of a border between an opening part and a light shielding part and FIG. 7B is a graph that illustrates a polarity of an amplitude of the exposure light.

This distortion is caused by the exposure light EL3 via a border area at which the plurality of mirror elements 141 corresponding to the opening part M1 are adjacent to the plurality of mirror elements 141 corresponding to the light shielding part M2. Next, a technical reason why this distortion arise will be described with reference to the intensity distribution of the exposure light via the mirror elements 141 illustrated in FIG. 7A. The mirror elements 141 illustrated in FIG. 7A represents one portion of the mirror elements 141 corresponding to a neighborhood of a border between the opening part M1 and the light shielding part M2 among the mirror elements illustrated in FIG. 6B. The exposure light EL3 projected on the wafer 161 via these mirror elements 141 includes the exposure light EL3 via the mirror element 141(0) corresponding to the opening part M1 and the exposure light EL3 via the mirror element 141(0) and the mirror element 141($\pi$) corresponding to the light shielding part M2.

Figure 7B:
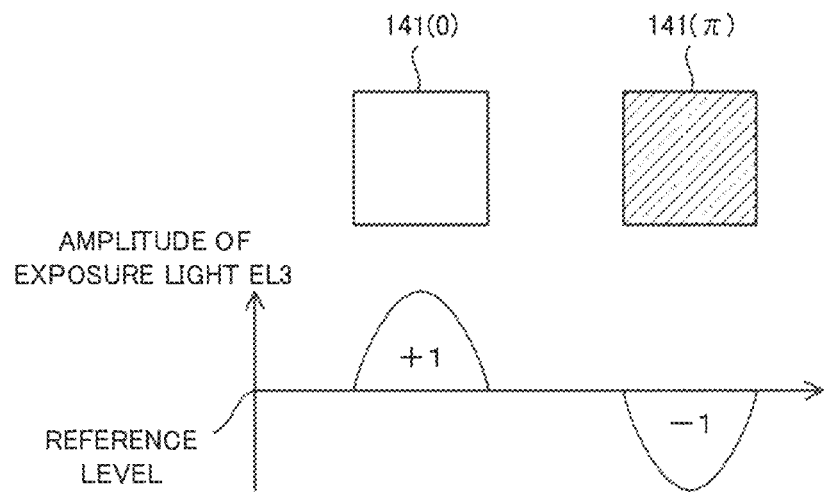

Here, as described above, the phase of the exposure light EL3 via the mirror element 141 (0) is inverted from (namely, is different by 180 degree from) the phase of the exposure light EL3 via the mirror element 141($\pi$). Thus, as illustrated in FIG. 7B, it can be said that a polarity of the exposure light EL3 via the mirror element 141 (0) is inverted from a polarity of the exposure light EL3 via the mirror element 141($\pi$). Therefore, when an amplitude of the exposure light EL3 via the mirror element 141 (0) is represented by "1

(namely, +1)", an amplitude of the exposure light EL3 via the mirror element 141 (π) is represented by "−1", for the purpose of clear description. Note that a reference level (a zero level) of the amplitude of the exposure light EL3 corresponds to an average value of a peak value of the amplitude of the exposure light EL3 via the mirror element 141 (0) and a peak value of the amplitude of the exposure light EL3 via the mirror element 141 (π).

Figures 8A, 8B:
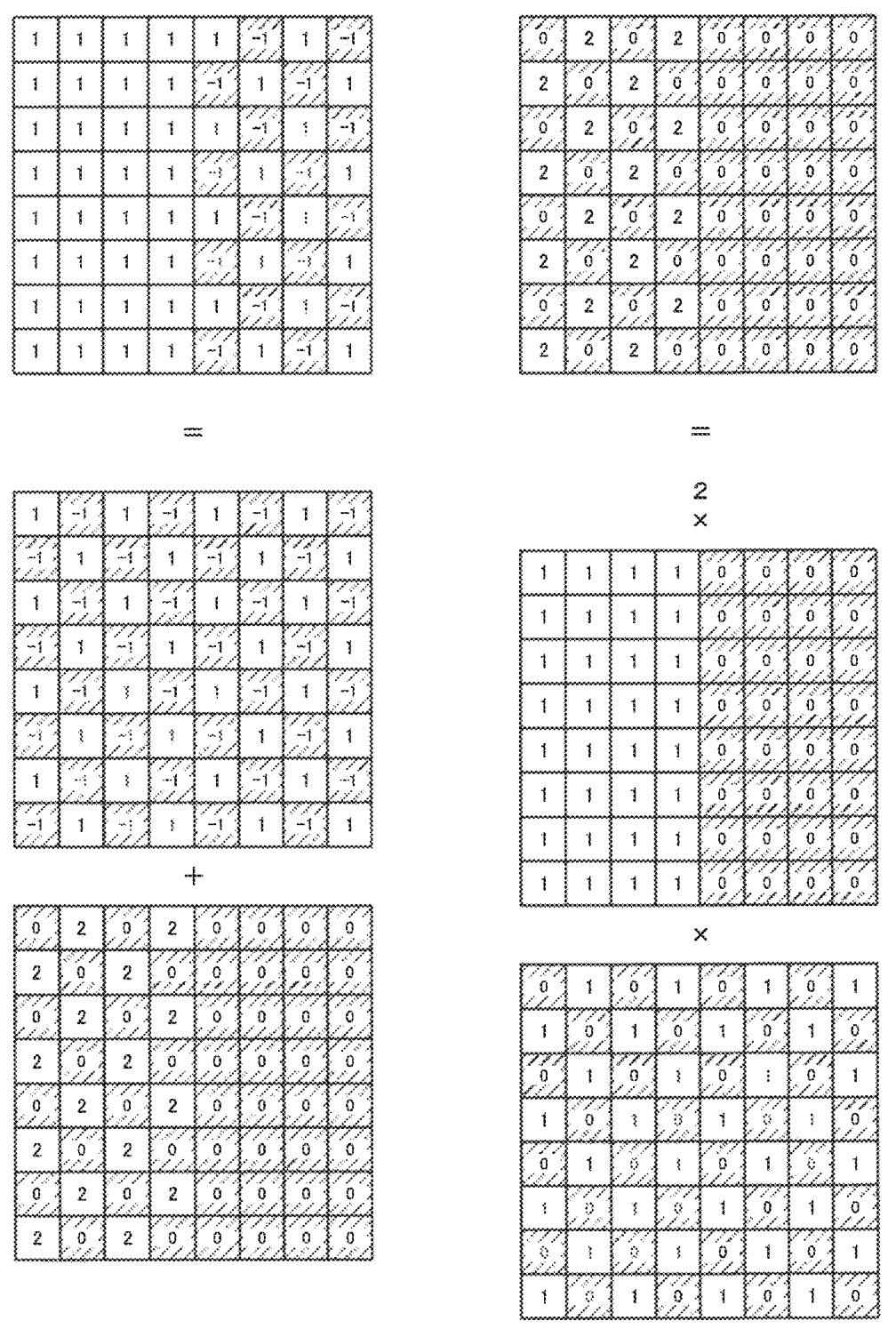

Considering the amplitudes of the exposure lights EL3 via the mirror element 141 (0) and the mirror element 141 (π), an amplitude distribution of the exposure light EL3 via the mirror elements 141 illustrated in FIG. 7A is an amplitude distribution illustrated in a first top part of FIG. 8A. Moreover, the amplitude distribution illustrated in the first top part of FIG. 8A is divided into an amplitude distribution illustrated in a second top part of FIG. 8A and an amplitude distribution illustrated in a third top part of FIG. 8A. Note that the amplitude "2 (namely, +2)" illustrated in the third top part of FIG. 8A means an amplitude that is twice as large as the amplitude of the exposure light EL3 via the mirror element 141(0). Moreover, the amplitude "0" illustrated in the third top part of FIG. 8A means that the amplitude of the exposure light EL3 via the mirror element 141 is zero level (namely, the exposure light EL3 via the mirror element 141 is not substantially projected on the wafer 161).

The amplitude distribution of the exposure light EL3 illustrated in the second top part of FIG. 8A is equivalent to the amplitude distribution of the exposure light EL3 via the mirror element 141(0) and the mirror element 141(π) that are alternately distributed along each of the X direction and the Y direction. As described above, the exposure light EL3 via the mirror element 141(0) and the exposure light EL3 via the mirror element 141(π) cancel each other. Thus, the actual amplitude of the exposure light EL3 having the amplitude distribution illustrated in the second top part of FIG. 8A is zero (alternatively, is equal to or smaller than the predetermined intensity). Therefore, the amplitude distribution of the exposure light EL3 illustrated in the second top part of FIG. 8A is less likely to cause the distortion of the intensity distribution of the exposure light EL3.

On the other hand, the amplitude distribution of the exposure light EL3 illustrated in the third top part of FIG. 8A is divided into an amplitude distribution illustrated in a second top part of FIG. 8B and an amplitude distribution illustrated in a third top part of FIG. 8B, as illustrated in FIG. 8B.

Here, the amplitude distribution of the exposure light EL3 illustrated in the second top part of FIG. 8B is equivalent to the amplitude distribution of the exposure light EL3 via the mirror elements 141 illustrated in FIG. 7A (namely, the amplitude distribution of the exposure light EL3 illustrated in the first top part of FIG. 8A). Thus, it can be said that the exposure light EL3 having the amplitude distribution illustrated in the second top part of FIG. 8B is the exposure light EL3 for transferring the device pattern. Therefore, the amplitude distribution of the exposure light EL3 illustrated in the second top part of FIG. 8B is less likely to cause the distortion of the intensity distribution of the exposure light EL3. Thus, it is estimated that the amplitude distribution of the exposure light EL3 illustrated in the third top part of FIG. 8B is likely to cause the distortion of the intensity distribution of the exposure light EL3. Thus, the reason of the distortion of the intensity distribution of the exposure light EL3 will be examined more by converting the intensity of the exposure light EL3 in a real space illustrated in the second top part and the third top part of FIG. 8B into a spectrum of the exposure light EL3 in a Fourier space corresponding to the real space as illustrated in FIG. 9A and FIG. 9B.

Figure 9A:
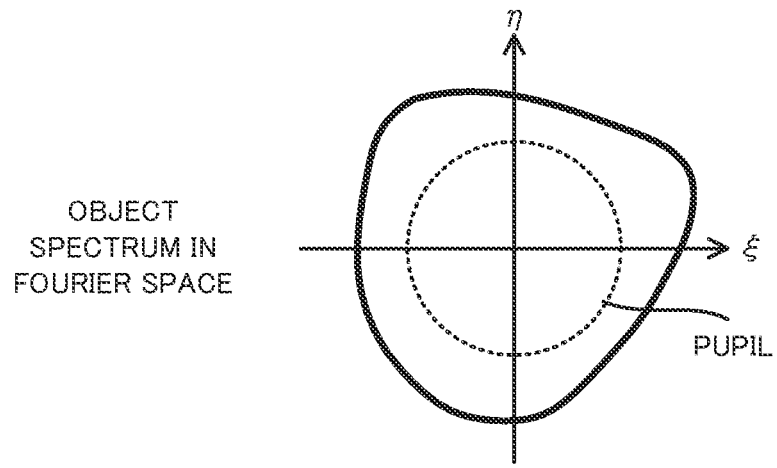
FIG. 9A is a graph that illustrates a spectrum of the exposure light that is illustrated in a second top part of FIG. 8B
Figure 9B:
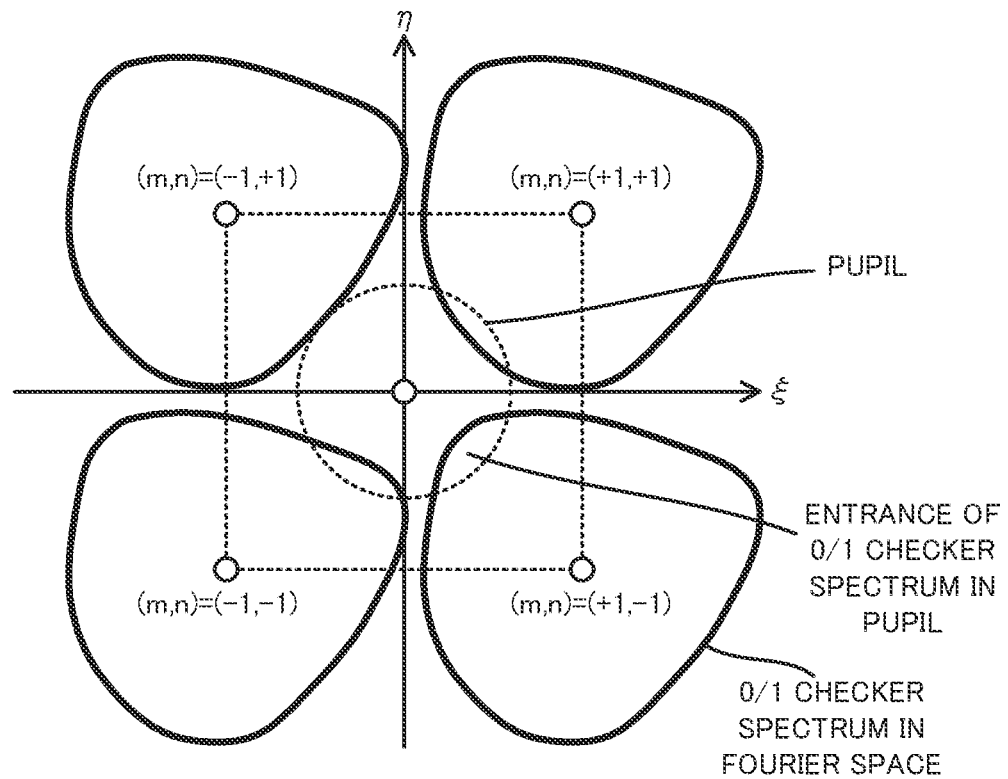
FIG. 9B is a graph that illustrates a spectrum of the exposure light (especially, a spectrum of a first-order diffracted light of the exposure light) that is illustrated in a third top part of FIG. 8B.

FIG. 9A illustrates the spectrum of the exposure light EL3 illustrated in the second top part of FIG. 8B. Note that the spectrum of the exposure light EL3 illustrated in the second top part of FIG. 8B is referred to as an "object spectrum" in the below described description, because the exposure light EL3 illustrated in the second top part of FIG. 8B is the exposure light EL3 for transferring the device pattern as described above. Moreover, FIG. 9B illustrates the spectrum of the exposure light EL3 (especially, the spectrum of a first order diffracted light of the exposure light EL3) illustrated in the third top part of FIG. 8B. Note that the spectrum of the exposure light EL3 illustrated in the second top part of FIG. 8B is referred to as a "0/1 checker spectrum" in the below described description, because the amplitude distribution of the exposure light EL3 illustrated in the third top part of FIG. 8B is the amplitude distribution in which the amplitude "0" and the amplitude "1" are alternately distributed along each of the X direction and the Y direction (so to speak, the amplitude distribution corresponding to a checker mark or a checkered pattern). According to the 0/1 checker spectrum illustrated in FIG. 9B, most part of the exposure light EL3 corresponding to the 0/1 checker spectrum (it is referred to as a "0/1 checker pattern light" in the below described description) propagates outside a pupil of the projection optical system 15. However, as illustrated in FIG. 9B, one portion of the 0/1 checker pattern light (especially, the 0/1 checker pattern light corresponding to the exposure light EL2 diffracted at the light modulation surface 14a) enters the pupil of the projection illumination system 15. This entrance of the 0/1 checker pattern light in the pupil of the projection optical system 15 becomes more prominent when a distribution area of the 0/1 checker spectrum in the Fourier space is expanded due to a convolution of the object spectrum and the 0/1 checker spectrum in the Fourier space (namely, an interference of the exposure light EL3 corresponding to the object spectrum and the 0/1 checker pattern light in the real space). This entrance of the 0/1 checker pattern light in the pupil of the projection optical system 15 is not necessary for transferring the device pattern. Therefore, it is estimated that the entrance of the 0/1 checker pattern light in the pupil of the projection optical system 15 causes the distortion of the intensity distribution of the exposure light EL3.

Thus, when the entrance of the 0/1 checker pattern light in the pupil of the projection optical system 15 is reduced (in other words, suppressed), the distortion of the intensity distribution of the exposure light EL3 is reduced (in other words, suppressed). Namely, the entrance of the 0/1 checker pattern light in the pupil of the projection optical system 15 is reduced (in other words, suppressed), the actual intensity distribution of the exposure light EL3 based on the modulation pattern data is closer to the ideal intensity distribution. Therefore, it can be said that the above described intensity distribution compensating process is a process for reducing the entrance of the 0/1 checker pattern light in the pupil of the projection optical system 15.

Note that FIG. 6A to FIG. 9 illustrates the distortion of the intensity distribution of the exposure light EL3 that arises when the device pattern used to form the single contact hole is transferred to the wafer 161. However, the distortion of the intensity distribution of the exposure light EL3 also arises when any device pattern is transferred to the wafer 161, for the same reason.

(2-3-2) Specific Example of Intensity Distribution Compensating Process

Next, a specific example of the intensity distribution compensating process will be described. In the below described description, four specific examples (a first specific example to a fourth specific example) of the intensity distribution compensating process will be described in order.

(2-3-2-1) First Specific Example of Intensity Distribution Compensating Process

The first specific example of the intensity distribution compensating process is an intensity distribution compensating process for correcting the modulation pattern data to directly minimize an entrance amount R of the 0/1 checker pattern light in the pupil of the projection optical system 15 (in other words, a distortion amount of the intensity distribution caused by the entrance of the 0/1 checker pattern light). Namely, the controller 21 corrects the modulation pattern data so that the entrance amount R of the 0/1 checker pattern light in the pupil is minimized.

Here, the entrance amount R ($\xi$, $\eta$) of the 0/1 checker pattern light at any coordinate ($\xi$, $\eta$) in the Fourier space is represented by an equation 2. Note that "p" in the equation 2 represents the size (the size in the X axis direction or the Y axis direction) of the mirror element 141 in the real space. Note that the size of the mirror element 141 in the X axis direction is same as the size of the mirror element 141 in the Y axis direction in the equation 2 for the purpose of simple description. However, the size of the mirror element 141 in the X axis direction may be different from the size of the mirror element 141 in the Y axis direction. In this case, "m$\lambda$/2p" and "n$\lambda$/2p" in the equation 2 may be replaced by "m$\lambda$/2px (note that px represents the size of the mirror element 141 in the X axis direction)" and "n$\lambda$/2py (note that py represents the size of the mirror element 141 in the Y axis direction)", respectively. Moreover, "$\lambda$" in the equation 2 represents the wavelength of the exposure light EL1. Moreover, "(m, n)" in the equation 2 represents a coordinate outside the pupil in the Fourier space (note that each of m and n is an integer value that is equal to or larger than 1 or is equal to or smaller than −1), and substantially corresponds to a coordinate at which the above described 0/1 checker spectrum appears. Moreover, "$a_{mn}$" in the equation 2 represents the 0/1 checker spectrum at the coordinate (m, n) and is represented by an equation 3. Moreover, "$T_{PATTERN}(\xi, \eta)$" in the equation 2 represents a spectrum of the spatial image that should be realized at the coordinate ($\xi$, $\eta$) to transfer the desired device pattern.

$$R(\xi, \eta) \propto \sum_{m,n \neq 0} \left| 2 a_{mn} T_{PATTERN}\left(\xi - \frac{m\lambda}{2p}, \eta - \frac{n\lambda}{2p}\right) \right| \quad \text{[Equation 2]}$$

$$a_{mn} = \frac{[1-(-1)^m][1-(-1)^n]}{-2mn\pi^2} \quad \text{[Equation 3]}$$

The entrance amount R of the 0/1 checker pattern light in the pupil is proportional to a value that is obtained by integrating the entrance amounts R ($\xi$, $\eta$), which is calculated by the equation 2, at all coordinates ($\xi$, $\eta$) in the pupil. Thus, the controller 21 corrects the modulation pattern data to satisfy an equation 4. Note that "($\xi$, $\eta$)$\in$ pupil" represents all coordinates ($\xi$, $\eta$) in the pupil. The correction of the modulation pattern data includes correcting at least one portion of the modulation pattern data so that at least one portion of the mirror elements 141 that is set to the 0 state on the basis of the modulation pattern data before the correction is set to the $\pi$ state on the basis of the modulation pattern data after the correction, for example. The correction of the modulation pattern data includes correcting at least one portion of the modulation pattern data so that at least one portion of the mirror elements 141 that is set to the $\pi$ state on the basis of the modulation pattern data before the correction is set to the 0 state on the basis of the modulation pattern data after the correction, for example.

$$\min_{mask} \sum_{(\xi,\eta)\in pupil} \sum_{m,n \neq 0} \left| 2 a_{mn} T_{PATTERN}\left(\xi - \frac{m\lambda}{2p}, \eta - \frac{n\lambda}{2p}\right) \right| \quad \text{[Equation 4]}$$

When the modulation pattern data is corrected to satisfy the equation 4, the entrance amount R of the 0/1 checker pattern light in the pupil of the projection optical system 15 is minimized. As a result, the distortion of the intensity distribution of the exposure light EL3 is also minimized. Namely, the actual intensity distribution of the exposure light EL3 based on the corrected modulation pattern data is the closest to the ideal intensity distribution. Therefore, an exposure accuracy of the exposure light EL3 via the spatial light modulator 14 improves.

Note that the controller 21 corrects the modulation pattern data so that the entrance amount R of the 0/1 checker pattern light in the pupil is minimized in the above described description. However, the controller 21 may correct the modulation pattern data so that the entrance amount R of the 0/1 checker pattern light in the pupil is equal to or smaller than a first predetermined amount or is reduced (in other words, decreases). Even in this case, the entrance amount R of the 0/1 checker pattern light in the pupil is reduced compared to the case where the modulation pattern data is not corrected. As a result, the distortion of the intensity distribution of the exposure light EL3 is also suppressed.

Moreover, in correcting the modulation pattern data to satisfy the equation 4, the controller 21 may use a constraint condition that the corrected modulation pattern data is the modulation pattern data by which the device pattern specified by the design layout is transferred to the wafer 161 appropriately. In other words, the controller 21 may not correct the modulation pattern data when the device pattern specified by the design layout is not transferred to the wafer 161 appropriately by the modulation pattern corrected to satisfy the equation 4. Alternatively, when the device pattern specified by the design layout is not transferred to the wafer 161 appropriately by the modulation pattern corrected to satisfy the equation 4, the controller 21 may correct the modulation pattern data so that the device pattern specified by the design layout is transferred to the wafer 161 appropriately and the entrance amount R of the 0/1 checker pattern light in the pupil calculated by the equation 4 is reduced to some extent (for example, is equal to or smaller than the first predetermined amount) although the equation 4 is not satisfied. The same applies to the case where the modulation pattern data is corrected in the below described second specific example to the fourth specific example.

Moreover, in correcting the modulation pattern data to satisfy the equation 4, the controller 21 may use a constraint condition that the cost function CF represented by the above described equation 1 is not too large (in other words, the cost function CF is equal to or smaller than a predetermined value). In other words, the controller 21 may not correct the modulation pattern data when the modulation pattern data corrected to satisfy the equation 4 results in too large cost function CF. Alternatively, when the modulation pattern data corrected to satisfy the equation 4 results in too large cost function CF, the controller 21 may correct the modulation pattern data so that the cost function CF is not too large and the entrance amount R of the 0/1 checker pattern light in the pupil calculated by the equation 4 is reduced to some extent (for example, is equal to or smaller than the first predetermined amount) although the equation 4 is not satisfied. The same applies to the case where the modulation pattern data is corrected in the below described second specific example to the fourth specific example.

Figure 10:
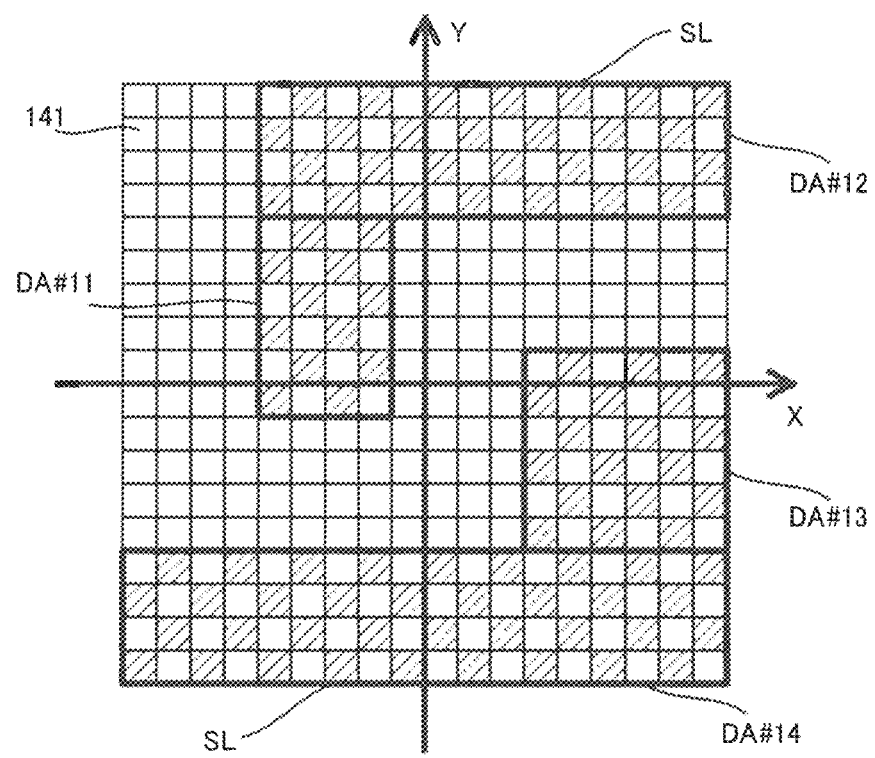
FIG. 10 is a planar view that illustrates a plurality of divided areas that are obtained by dividing a light shielding area in which there are a plurality of mirror elements corresponding to the light shielding part.
Figure 11A:
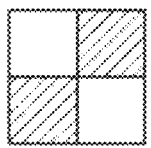
FIG. 11 Each of FIG. 11A
FIG. 11B is a planer view that illustrates a candidate of an arrangement pattern that is set to the divided area.
Figure 11B:
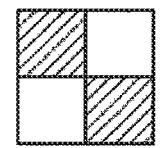

(2-3-2-2) Second Specific Example of Intensity Distribution Compensating Process Next, with reference to FIG. 10 to FIG. 11B, the second specific example of the intensity distribution compensating process will be described. As described above, the distortion of the intensity distribution of the exposure light EL3 is caused by the entrance of the 0/1 checker pattern light in the pupil of the projection optical system 15. The 0/1 checker pattern light corresponds to one portion of the exposure light EL3 via the border area at which the plurality of mirror elements 141 corresponding to the opening part M1 are adjacent to the plurality of mirror elements 141 corresponding to the light shielding part M2. Thus, it is estimated that the entrance amount R of the 0/1 checker pattern light in the pupil is reduced if a data part of the modulation pattern data for controlling the mirror elements 141 at the border area is corrected.

There are the plurality of mirror elements 141 corresponding to the opening part M1 and the plurality of mirror elements 141 corresponding to the light shielding part M2 at the border area. Therefore, the controller 21 corrects the data part of the modulation pattern data for controlling at least one portion of the plurality of mirror elements 141 corresponding to the opening part M1 and the plurality of mirror elements 141 corresponding to the light shielding part M2 to reduce the entrance amount R of the 0/1 checker pattern light in the pupil.

Here, as described above, the states of all of the plurality of mirror elements 141 corresponding to the opening part M1 are set to the 0 state (alternatively, the it state). This setting is to keep the intensity of the exposure light EL3 via the plurality of mirror elements 141 corresponding to the opening part M1 in a predetermined intensity. Thus, there is a possibility that there is relatively small scope to correct the data part of the modulation pattern data for controlling the plurality of mirror elements 141 corresponding to the opening part M1. This is because there is a possibility that the intensity of the exposure light EL3 via the plurality of mirror elements 141 corresponding to the opening part M1 decreases when at least one portion of the mirror elements 141 that is set to the 0 state on the basis of the modulation pattern data before the correction is set to the it state on the basis of the modulation pattern data after the correction. On the other hand, the states of the plurality of mirror elements 141 corresponding to the light shielding part M2 are set to the state in which the mirror element 141(0) and the mirror element 141($\pi$) are alternately distributed along each of the X direction and the Y direction. This setting is to make the intensity of the exposure light EL3 via the plurality of mirror elements 141 corresponding to the light shielding part M2 be zero (alternatively, be equal to or smaller than a predetermined intensity). Therefore, the states of the plurality of mirror elements 141 corresponding to the light shielding part M2 are allowed to be set to any state, as long as the intensity of the exposure light EL3 is zero (alternatively, is equal to or smaller than a predetermined intensity). Therefore, there is relatively large scope to correct the data part of the modulation pattern data for controlling the plurality of mirror elements 141 corresponding to the light shielding part M2.

For the above described reason, in the second specific example, the controller 21 corrects the data part of the modulation pattern data for controlling the plurality of mirror elements 141 corresponding to the light shielding part M2 to reduce the entrance amount R of the 0/1 checker pattern light in the pupil. Especially, the controller 21 corrects the data part of the modulation pattern data for controlling the plurality of mirror elements 141 corresponding to the light shielding part M2 that exists at the border area and the light shielding part M2 that does not exist at the border area, in order to reduce a processing load to determine whether or not the plurality of mirror elements 141 corresponding to the light shielding part M2 exist at the border area. However, the controller 21 may correct the data part of the modulation pattern data for controlling the plurality of mirror elements 141 corresponding to the light shielding part M2 that exists at the border area and may not correct the data part of the modulation pattern data for controlling the plurality of mirror elements 141 corresponding to the light shielding part M2 that does not exist at the border area.

In the second specific example, the controller 21 corrects the data part for controlling the plurality of mirror elements 141 corresponding to the light shielding part M2 according to the following procedure. Specifically, the controller 21 divides a light shielding area SL at which the plurality of mirror elements 141 corresponding to the light shielding part M2 are located into a plurality of divided areas DA having predetermined shapes on the light modulation surface 14a of the spatial light modulator 14, as illustrated in FIG. 10. The predetermined shape is a rectangular shape, for example. However, the predetermined shape may be any shape different from the rectangular shape. FIG. 10 illustrates an example in which the light shielding area is divided into four rectangular divided areas DA #1 to DA #4.

Then, the controller 21 sets, as an arrangement pattern of the mirror element 141(0) and the mirror element 14($\pi$) in each divided area DA, an arrangement pattern that allows the intensity of the exposure light EL3 via each divided area DA to be zero. The controller 21 may set same arrangement pattern to the plurality of divided areas DA. The controller 21 may set different arrangement patterns to the plurality of divided areas DA.

In this case, the controller 21 selects, as the arrangement pattern set to each divided area DA, one candidate pattern from a plurality of pattern candidates each of which corresponds to the arrangement pattern that allows the intensity of the exposure light EL3 to be zero. For example, the controller 21 selects a first candidate pattern as the arrangement pattern set to the divided area DA #1 and selects the first candidate pattern or a second candidate pattern that is different from the first candidate pattern as the arrangement pattern set to the divided area DA #2. The plurality of pattern candidates may be stored in the memory 22 or may be generated by the controller 21.

Here, as described above, the reason why the intensity of the exposure light EL3 via the plurality of mirror elements 141 corresponding to the light shielding part M2 is zero is that the states of the plurality of mirror elements 141 corresponding to the light shielding part M2 are set to the state that allows the exposure light EL3 via the mirror element 141(0) and the exposure light EL3 via the mirror element 141($\pi$) that is adjacent to this mirror element 141(0) to cancel each other. Thus, the arrangement pattern in which the mirror element 141(0) and the mirror element 141(π) are arranged so that the exposure light EL3 via the mirror element 141(0) and the exposure light EL3 via the mirror element 141(π) that is adjacent to this mirror element 141(0) cancel each other is set to each divided area DA. This arrangement pattern is likely to be an arrangement pattern in which a basic pattern having at least one mirror element 141(0) and at least one mirror element 141(π) arranged on the basis of a predetermined rule appears repeatedly along the X axis direction and the Y axis direction. Thus, the plurality of pattern candidates that are the candidates for the arrangement pattern set to each divided area DA may include a plurality of basis patterns. For example, as illustrated in FIG. 11A and FIG. 11B, the plurality of pattern candidates may include a basic pattern #1 in which two mirror elements 141(0) and two mirror elements 141(π) are arranged in 2×2 matrix so that the mirror element 141(0) and the mirror element 141(π) are adjacent to each other along each of the X axis direction and the Y axis direction and a basic pattern #2 that is obtained by inverting the basic pattern #1 (namely, by replacing the mirror element 141(0) and the mirror element 141(π) in the basic pattern #1 by the mirror element 141(π) and the mirror element 141(0), respectively). Alternatively, the plurality of pattern candidates may include a basic pattern in which any number of mirror element(s) 141(0) and any number of mirror element(s) 141(π) are arranged so that the mirror element 141(0) and the mirror element 141(π) are arranged according to a first arrangement aspect, a basic pattern in which the mirror element 141(0) and the mirror element 141(π) are arranged according to a second arrangement aspect, . . . , and a basic pattern in which the mirror element 141(0) and the mirror element 141(π) are arranged according to a s-th (note that s is an integer number that is equal to or larger than 2) arrangement aspect.

The entrance amount R of the 0/1 checker pattern light in the pupil under the situation where the light shielding area SL is divided into the plurality of divided areas DA is represented by an equation 5. Note that "N" in the equation 5 represents a total number of the divided areas DA. "i" in the equation 5 represents an identification number that is unique to each of N divided areas DA and is an integer number that satisfies 1=i=N. "$T_{CHECKER}^{(i)}(\xi, \eta)$," in the equation 5 represents a spectrum of the exposure light EL3 via the i-th divided area DA at the coordinate (ξ, η). "sign(i)" represents a function a value including a sign of which varies depending on the arrangement pattern (the pattern candidate or the basic pattern) set to the i-th divided area DA. For example, in an example of the pattern candidates illustrated in FIG. 11A and FIG. 11B, sign(i) may be a function that is to be either one of +1 and −1 when the pattern candidate illustrated in FIG. 11A is set to the i-th divided area DA and that is to be the other one of +1 and −1 when the pattern candidate illustrated in FIG. 11B is set to the i-th divided area DA. For example, sign(i) may be a function that is to be either one of +k1 and −k1 (note that k1 is any real number) when a first pattern candidate is set to the i-th divided area DA, that is to be either one of +k2 and −k2 (note that k2 is any real number that is same as or different from k1) when a second pattern candidate is set to the i-th divided area DA, . . . , and that is to be either one of +kq and −kq (note that kq is any real number that is same as or different from at least one of k1 to kq−1) when q-th (note that q is an integer number that is equal to or larger than 2) pattern candidate is set to the i-th divided area DA.

$$R \propto \sum_{(\xi,\eta)\in pupil} \left| \sum_{i=1}^{N} \text{sign}(i) \times T_{CHECKER}^{(i)}(\xi, \eta) \right| \quad \text{[Equation 5]}$$

The controller 21 calculates the entrance amount R of the 0/1 checker pattern light in the pupil by using the equation 5 every time the arrangement pattern is set to each divided area DA. The controller 21 adjusts the arrangement pattern set to each divided area DA so that this entrance amount R is minimized. Namely, the controller 21 sets the appropriate arrangement pattern to each divided area DA so that this entrance amount R is minimized (namely, an equation 6 is satisfied).

$$\min_{sign} \sum_{(\xi,\eta)\in pupil} \left| \sum_{i=1}^{N} \text{sign}(i) \times T_{CHECKER}^{(i)}(\xi, \eta) \right| \quad \text{[Equation 6]}$$

According to the second specific example, the controller 21 does not necessarily correct whole of the modulation pattern data in executing the intensity distribution compensating process. Namely, the controller 21 corrects one portion of the modulation pattern data (for example, the data part for controlling the plurality of mirror elements 141 corresponding to the light shielding part M2) to complete the intensity distribution compensating process. In other words, the controller 21 completes the intensity distribution compensating process without correcting the other one portion of the modulation pattern data. Therefore, a processing load necessary for the intensity distribution compensating process is reduced compared to the first specific example in which there is a possibility that whole of the modulation pattern data is corrected.

Especially in the second specific example, the controller 21 corrects the data part of the modulation pattern data for controlling the plurality of mirror elements 141 located in the divided area DA that is a designated area to complete the intensity distribution compensating process. Namely, the controller 21 corrects the data part of the modulation pattern data that is determined in advance as the data part that should be corrected to complete the intensity distribution compensating process. Therefore, the processing load necessary for the intensity distribution compensating process is reduced compared to the first specific example in which a guide that indicates which data part in the modulation pattern data should be corrected is not used.

Moreover, in the second specific example, the controller 21 executes an operation of selecting one candidate pattern that should be set to the divided area DA from the plurality of candidate patterns for all of the plurality of divided areas DA to complete the intensity distribution compensating process. Namely, the controller 21 determines relatively easily how to correct the data part for controlling the mirror elements 141 located in each divided area DA by selecting one candidate pattern from the plurality of candidate patterns. Therefore, the processing load necessary for the intensity distribution compensating process is reduced compared to the first specific example in which a guide that indicates how to correct the modulation pattern data (namely, there is a possibility that the modulation pattern data is corrected is corrected randomly) is not used.

Note that the controller 21 may correct the data part of the modulation pattern data for controlling the plurality of mirror elements 141 corresponding to the opening part M1, in addition to or instead of correcting the data part of the modulation pattern data for controlling the plurality of mirror elements 141 corresponding to the light shielding part M2. In this case, the controller 21 divides an area at which the plurality of mirror elements 141 corresponding to the opening part M1 are located into the plurality of divided areas DA. Then, the controller 21 sets, as an arrangement pattern of the mirror element 141(0) and the mirror element 14(π) in each divided area DA, an arrangement pattern that allows the intensity of the exposure light EL3 via each divided area DA to be equal to or larger than the predetermined intensity. Note that the above described dividing method and setting method are usable as a method of dividing into the divided areas DA and a method of setting the arrangement pattern, respectively.

(2-3-2-3) Third Specific Example of Intensity Distribution Compensating Process

Next, with reference to FIG. 12A and FIG. 12B, the third specific example of the intensity distribution compensating process will be described. The third specific example of the intensity distribution compensating process divides the light shielding area SL at which the plurality of mirror elements 141 corresponding to the light shielding part M2 are located into the plurality of divided areas DA having the predetermined shapes, as with the second specific example of the intensity distribution compensating process. Then, the third specific example of the intensity distribution compensating process sets the appropriate arrangement pattern to each divided area DA so that the entrance amount R of the 0/1 checker pattern light in the pupil is minimized, as with the second specific example of the intensity distribution compensating process.

Figure 12A:
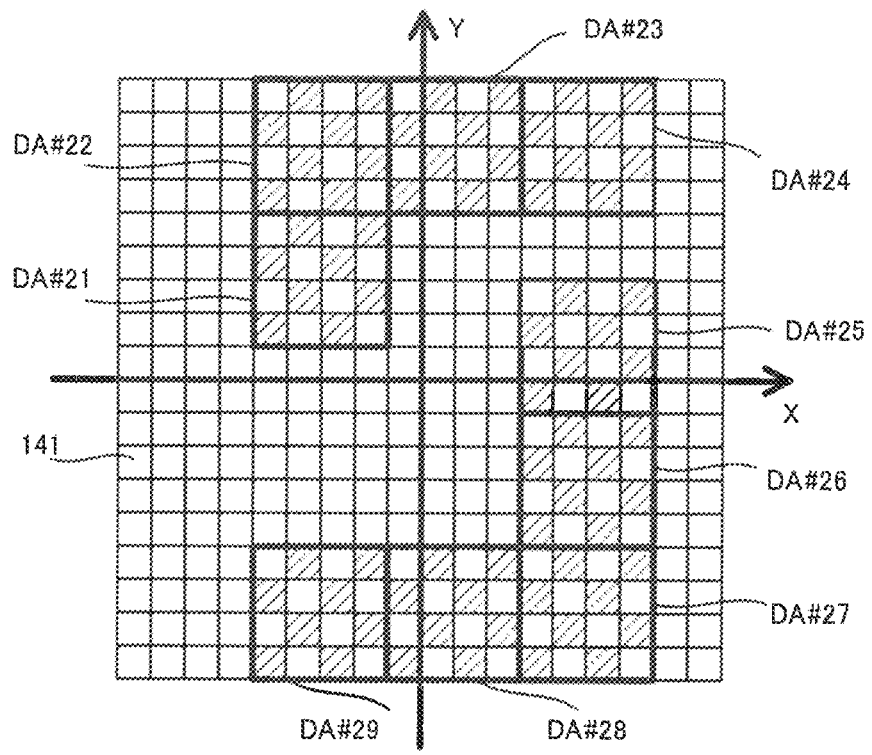
FIG. 12A is a planar view that illustrates the plurality of divided areas that are obtained by dividing the light shielding area in which there are the plurality of mirror elements corresponding to the light shielding part and FIG. 12B is a planar view that illustrates a certain divided area in a real space.
Figure 12B:
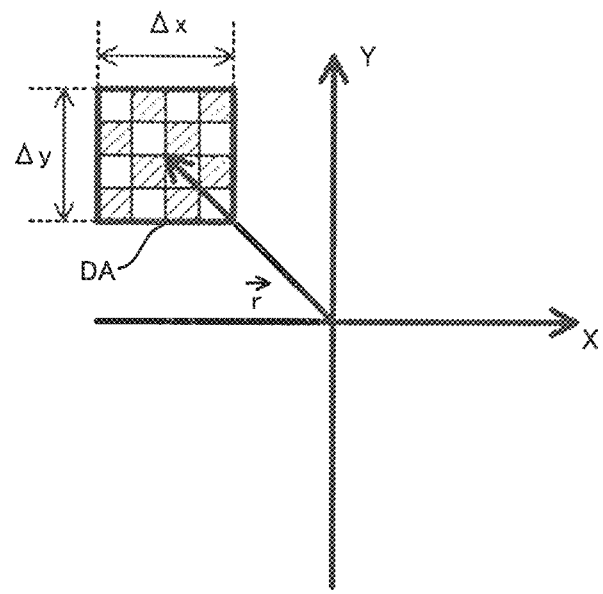

However, as illustrated in FIG. 12A, the third specific example of the intensity distribution compensating process is different from the second specific example of the intensity distribution compensating process in which sizes of the plurality of divided areas DA may be different in that sizes of the plurality of divided areas DA are uniformed. Furthermore, in the third specific example, an equation 7 is usable instead of the above described equation 5 as an equation for representing the entrance amount R of the 0/1 checker pattern light in the pupil, because the sizes of the plurality of divided areas DA are uniformed. Therefore, in the third specific example, the controller 21 sets the appropriate arrangement pattern to each divided area DA so that an equation 8 is satisfied. Note that "1 (specifically, vector 1)" in the equation 8 represents a vector indicating the coordinate (ξ, η). "I(l)" in the equation 8 represents a spectrum of the exposure light EL3 via innumerable virtual mirror elements 141 in which the mirror element 141(0) and the mirror element 141(π) are alternately distributed along each of the X axis direction and the Y axis direction at a position represented by the vector 1 (namely, the coordinate (ξ, η)) and is represented by an equation 9. "$b_{mn}$" in the equation 9 represents a spectrum of the exposure light EL3 via the above described innumerable virtual mirror elements 141 at the coordinate (m, n)) and is represented by an equation 10. "δ" in the equation 9 represents a Dirac's delta function. "j" in the equation 8 represents a complex number. "$r_i$ (specifically, vector $r_i$)" in the equation 8 represents a vector specifying a coordinate of the i-th divided area in the real space, as illustrated in FIG. 12B. "jinc(l)" in the equation 8 is represented by an equation 11. "$\Delta_x$" in the equation 11 represents a size of the divided area DA along the X axis direction in the real space. "$\Delta_y$" in the equation 11 represents a size of the divided area DA along the Y axis direction in the real space. "k" in the equation 11 is a predetermined coefficient. Other characteristics of the third specific example of the intensity distribution compensating process may be same as other characteristics of the second specific example of the intensity distribution compensating process.

$$R \propto \sum_{\vec{l} \in pupil} \left| [\tilde{I}(\vec{l}) * jinc(\vec{l})] \sum_{i=1}^{N} \text{sign}(i) \times \exp(-j\vec{l} \times \vec{r_i}) \right| \quad \text{[Equation 7]}$$

$$\min_{sign} \sum_{\vec{l} \in pupil} \left| [\tilde{I}(\vec{l}) * jinc(\vec{l})] \sum_{i=1}^{N} \text{sign}(i) \times \exp(-j\vec{l} \times \vec{r_i}) \right| \quad \text{[Equation 8]}$$

$$\tilde{I}(\vec{l}) = \sum_{m,n \neq 0} \left| b_{mn} \delta\left(\xi - \frac{m\lambda}{2p}, \eta - \frac{n\lambda}{2p}\right) \right| \quad \text{[Equation 9]}$$

$$b_{mn} = \frac{[1-(-1)^m][1-(-1)^n]}{-mn\pi^2} \quad \text{[Equation 10]}$$

$$jinc(\vec{l}) = \Delta_x \Delta_y \text{sinc}\left(k\xi \frac{\Delta_x}{2}\right) \text{sinc}\left(k\eta \frac{\Delta_y}{2}\right) \quad \text{[Equation 11]}$$

Here, as can be seen from the equation 8 to the equation 11, the variable that varies depending on the change of the arrangement pattern set to the divided area DA among the variables included in the equation 8 is "sign(i)". On the other hand, "I(l)", "jinc(l)" and "exp(–jl×$r_i$)" in the equation 8 are the variables that do not vary when the arrangement pattern set to the divided area DA is changed (namely, are substantially fixed values). This is because the sizes of the plurality of divided areas DA are uniformed and thus weights of influences to the entrance amount R of the 0/1 checker pattern light in the pupil from the plurality of divided areas DA are also equalized. Thus, in the third specific example, the controller 21 is allowed to calculate the entrance amount R of the 0/1 checker pattern light in the pupil by keeping "I(l)", "jinc(l)" and "exp(–jl×$r_i$)" in the constant value even when the arrangement pattern set to the divided area DA is changed. Thus, a processing load necessary for calculating the entrance amount R of the 0/1 checker pattern light in the pupil is reduced in the third specific example compared to the second specific example. Namely, the processing load necessary for the intensity distribution compensating process is reduced in the third specific example compared to the second specific example.

Note that the controller 21 may set the appropriate arrangement pattern to each divided area DA according to the following procedure so that the equation 8 is satisfied by using the fact that "I(l)", "jinc(l)" and "exp(–jl×$r_i$)" do not vary when the arrangement pattern set to the divided area DA is changed. Specifically, the controller 21 firstly calculates the vector 1 indicating the coordinate (ξ, η) (especially, the vector 1 indicating the coordinate (ξ, η) in the pupil of the projection optical system 15) at which there exists the spectrum that contributes to a formation of the spatial image for transferring the device pattern relatively largely by evaluating (for example, calculating the value) I(l)*jinc(1). Alternatively, the controller 21 firstly calculates the vector 1 indicating the coordinate (ξ, η) at which there exists the spectrum that contributes to the transfer of the device pattern relatively largely. This vector 1 is a vector indicating the coordinate (ξ, η) at which a first order diffracted light of the exposure light EL3 appears, for example. Then, the controller 21 tentatively sets the arrangement pattern to each divided area DA so that the entrance amount R of the 0/1 checker pattern light in the pupil is minimized for the calculated vector 1 (however, addition over all coordinates ($\xi$, $\eta$) in the pupil in the equation 8 is not executed), and then properly changes the arrangement pattern set to each divided area DA on the basis of the arrangement pattern that is tentatively set so that the entrance amount R of the 0/1 checker pattern light in the pupil is minimized to set the appropriate arrangement pattern to each divided area DA.

(2-3-2-4) Fourth Specific Example of Intensity Distribution Compensating Process Next, with reference to FIG. 13A to FIG. 14, the fourth specific example of the intensity distribution compensating process will be described. The fourth specific example of the intensity distribution compensating process divides the light shielding area SL at which the plurality of mirror elements 141 corresponding to the light shielding part M2 are located into the plurality of divided areas DA having the same sizes, as with the third specific example of the intensity distribution compensating process. Then, the fourth specific example of the intensity distribution compensating process sets the appropriate arrangement pattern to each divided area DA so that the entrance amount R of the 0/1 checker pattern light in the pupil is minimized, as with the third specific example of the intensity distribution compensating process.

However, in the fourth specific example of the intensity distribution compensating process, the controller 21 does not calculate the entrance amount R of the 0/1 checker pattern light in the pupil in setting the appropriate arrangement pattern to each divided area DA. The controller 21 sets the appropriate arrangement pattern to each divided area DA on the basis of states of the mirror elements 141 in the plurality of divided areas DA and an arrangement manner of the plurality of divided areas DA, instead of calculating the entrance amount R of the 0/1 checker pattern light in the pupil.

Specifically, when the mirror element 141(0) and the mirror element 141($\pi$) are alternately distributed along each of the X axis direction and the Y axis direction in the plurality of divided areas DA, the controller 21 sets the different two types of arrangement patterns to two divided areas DA that are adjacent to each other along a direction intersecting with each of the X axis direction and the Y axis direction. In this case, the controller 21 may use, as the different two types of arrangement patterns, two types of arrangement patterns that are inverted from each other.

Figure 13A:
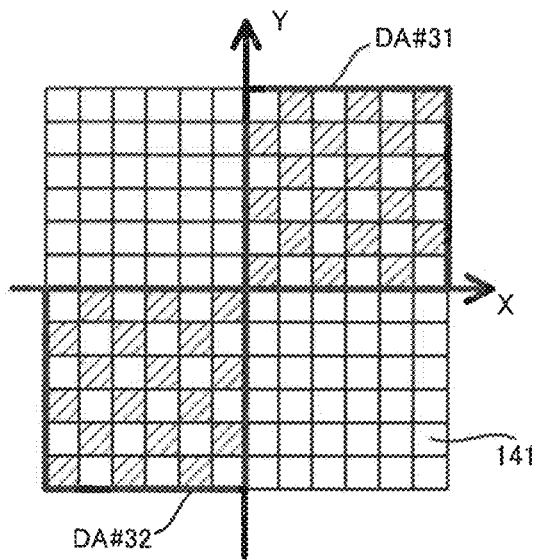
FIG. 13A is a planar view that illustrates two divided areas that are adjacent to each other in a direction that intersects with each of a X axis direction and a Y axis direction.

For example, FIG. 13A illustrates two divided areas DA #31 and DA #32 that are adjacent to each other along a direction intersecting with each of the X axis direction and the Y axis direction. These two divided areas DA #31 and DA #32 may exists in an area in which the mirror elements 141 controlled to form adjacent two contact holes are disposed, for example. In the two divided areas DA #31 and DA #32, the mirror element 141(0) and the mirror element 141($\pi$) are alternately distributed along each of the X axis direction and the Y axis direction. Thus, the controller 21 sets the arrangement pattern to each of the two divided areas DA #31 and DA #32 so that the arrangement pattern set to the divided area DA #32 is an arrangement pattern that is obtained by inverting the arrangement pattern set to the divided area DA #31, as illustrated in FIG. 13B. As a result, the intensity distribution of the exposure light EL3 via these two divided areas DA #31 and DA #32 is the intensity distribution illustrated in FIG. 13C.

Figure 13D:
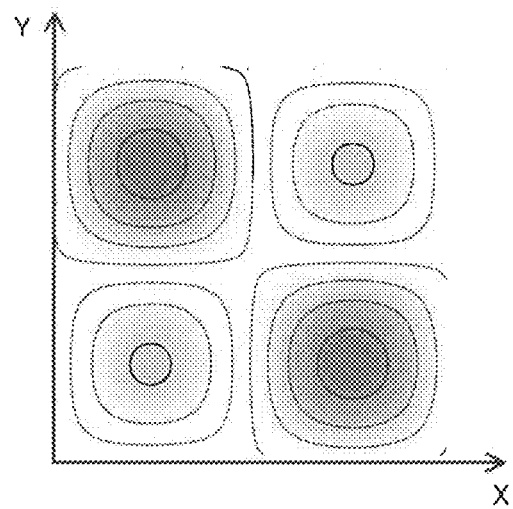
FIG. 13C is a graph that illustrates the intensity distribution of the exposure light via the divided areas to which the arrangement patterns illustrated in FIG. 13A are set and FIG. 13D is a graph that illustrates the intensity distribution of the exposure light via the divided areas to which the arrangement patterns illustrated in FIG. 13B are set.
Figure 13B:
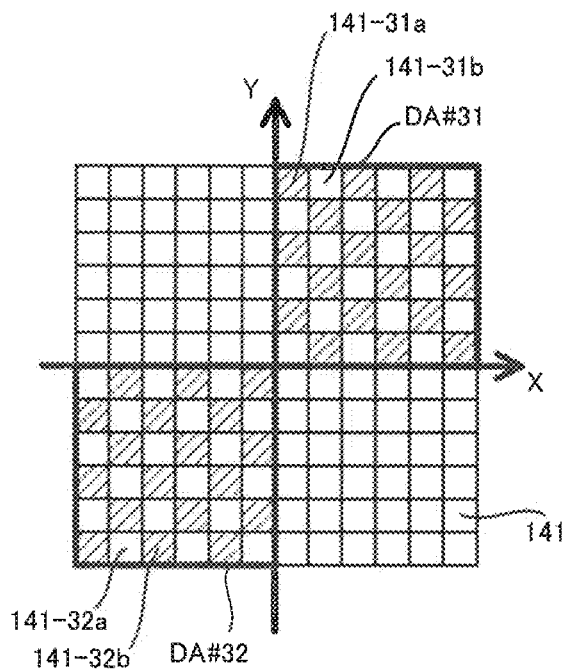
FIG. 13B is a planar view that illustrates the arrangement patterns that are set to the two divided areas illustrated in FIG. 13A by an intensity distribution compensating process.
Figure 13C:
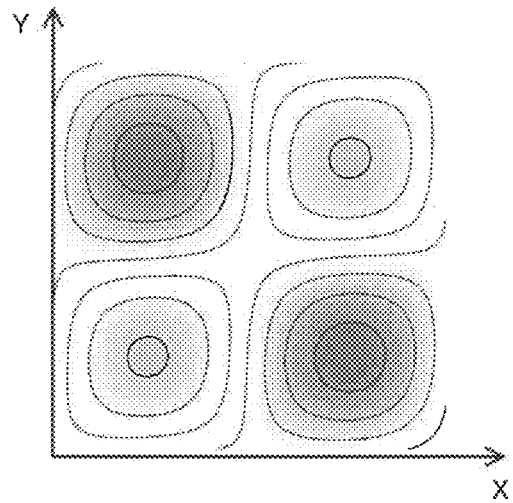

Just for reference, the intensity distribution of the exposure light EL3 via the divided areas DA #31 and DA #32 to which same arrangement patterns are set (see FIG. 13A) is the intensity distribution illustrated in FIG. 13D. As illustrated in FIG. 13C and FIG. 13D, it turns out that the distortion of the intensity distribution of the exposure light EL3 is reduced when two types of arrangement patterns that are inverted from each other are set to the two divided areas DA #31 and DA #32, compared to the case where the same arrangement patterns are set to the two divided areas DA #31 and DA #32. Therefore, it turns out that the entrance amount R of the 0/1 checker pattern light in the pupil is reduced when two types of arrangement patterns that are inverted from each other are set to the two divided areas DA #31 and DA #32, compared to the case where the same arrangement patterns are set to the two divided areas DA #31 and DA #32.

Alternatively, when a mirror element group including the plurality of mirror elements 141(0) sequentially arranged along the X axis direction and a mirror element group including the plurality of mirror elements 141($\pi$) sequentially arranged along the X axis direction are alternately distributed along the Y axis direction in the plurality of divided areas DA, the controller 21 sets different two types of arrangement patterns (for example, two types of arrangement patterns that are inverted from each other) to two divided areas DA that are adjacent to each other along the Y axis direction. Alternatively, when a mirror element group including the plurality of mirror elements 141(0) sequentially arranged along the Y axis direction and a mirror element group including the plurality of mirror elements 141($\pi$) sequentially arranged along the Y axis direction are alternately distributed along the X axis direction in the plurality of divided areas DA, the controller 21 sets two types of arrangement patterns that are inverted from each other to two divided areas DA that are adjacent to each other along the X axis direction.

Figure 14A:
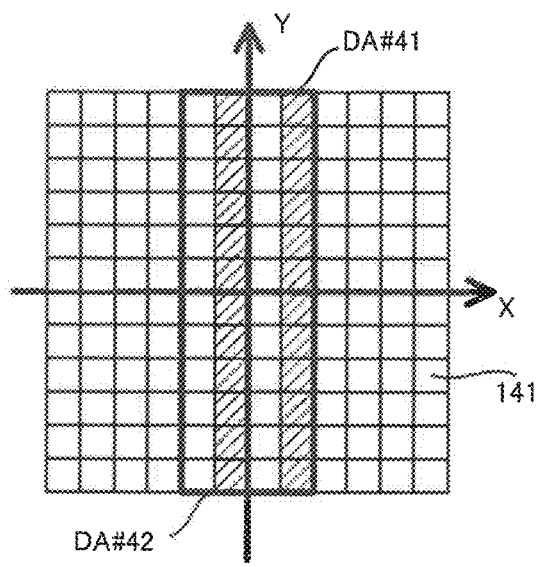
FIG. 14A is a planar view that illustrates two divided areas that are adjacent to each other in the X axis direction.
Figure 14B:
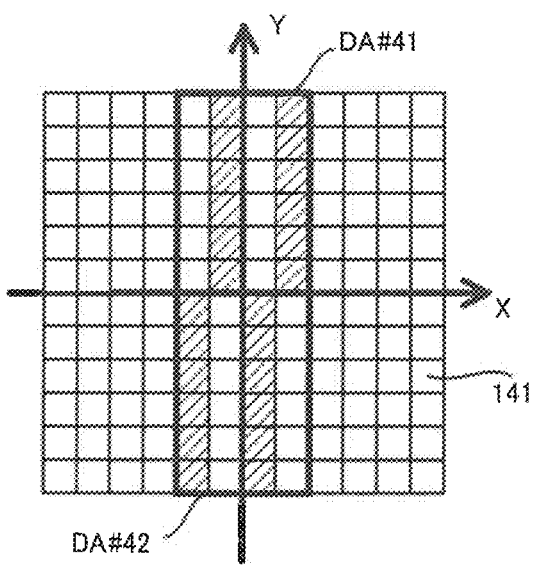
FIG. 14B is a planar view that illustrates the arrangement patterns that are set to two divided areas illustrated in FIG. 14A by the intensity distribution compensating process and FIG. 14C is a graph that illustrates the intensity distribution of a spatial image.
Figure 14C:
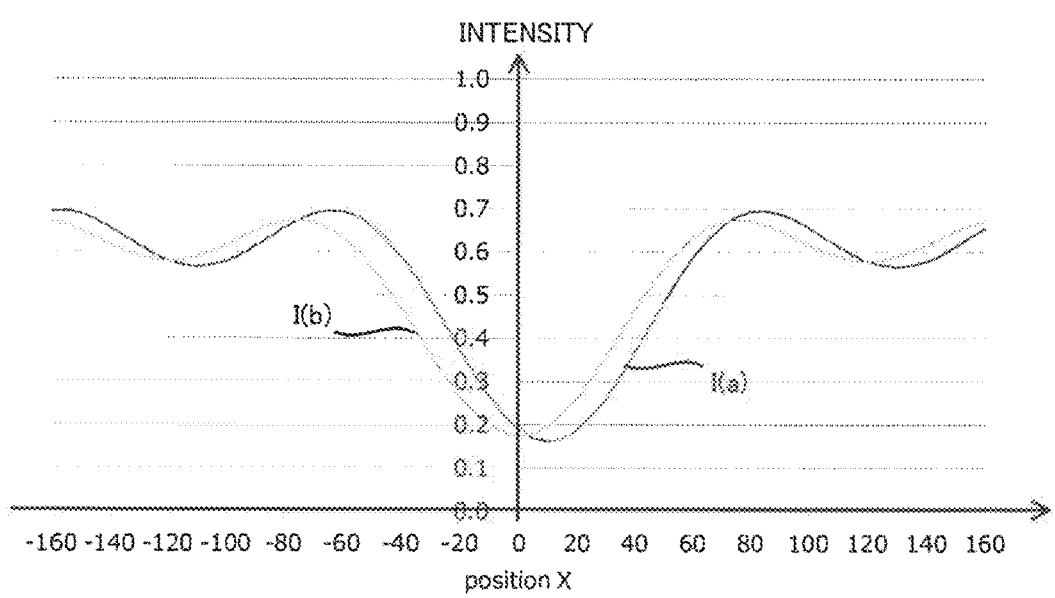

For example, FIG. 14A illustrates two divided areas DA #41 and DA #42 that are adjacent to each other along the Y axis direction. In the two divided areas DA #41 and DA #42, the mirror element group including the plurality of mirror elements 141(0) sequentially arranged along the Y axis direction and the mirror element group including the plurality of mirror elements 141($\pi$) sequentially arranged along the Y axis direction are alternately distributed along the X axis direction. Thus, the controller 21 sets the arrangement pattern to each of the two divided areas DA #41 and DA #42 so that the arrangement pattern set to the divided area DA #42 is an arrangement pattern that is obtained by inverting the arrangement pattern set to the divided area DA #41, as illustrated in FIG. 14B. As a result, as illustrated in FIG. 14C, the distortion of the intensity distribution of the exposure light EL3 is reduced when two types of arrangement patterns that are inverted from each other are set to the two divided areas DA #41 and DA #42, compared to the case where the same arrangement patterns are set to the two divided areas DA #41 and DA #42. FIG. 14C illustrates an intensity distribution I(a) along the X axis direction of the spatial image that is obtained when the arrangement pattern illustrated in FIG. 14A is used and an intensity distribution I(b) along the X axis direction of the spatial image that is obtained when the arrangement pattern illustrated in FIG. 14B is used. As is clear from FIG. 14C, a horizontal shift of the intensity distribution (the distortion of the intensity distribution) is smaller in the case of the intensity distribution I(b) of the spatial image when the arrangement pattern illustrated in FIG. 14B is used. Therefore, the entrance amount R of the 0/1 checker pattern light in the pupil is reduced when two types of arrangement patterns that are inverted from each other are set to the two divided areas DA #41 and DA #42, compared to the case where the same arrangement patterns are set to the two divided areas DA #41 and DA #42.

Alternatively, when the mirror elements 141(0) and 141(π) are distributed on the basis of a predetermined arrangement rule in the plurality of divided areas DA, the controller 21 may set different two types of arrangement patterns (for example, two types of arrangement patterns that are inverted from each other) to two divided areas DA that are adjacent to each other along a direction based on the predetermined arrangement rule or that are arranged in an arrangement manner based on the predetermined arrangement rule, not limited to an example illustrated in FIG. 13A to FIG. 14C.

According to the fourth specific example, the controller 21 sets the appropriate arrangement pattern to each divided area DA on the basis of the states of the mirror elements 141 in the plurality of divided areas DA and an arrangement direction of the plurality of divided areas DA. Thus, the processing load necessary for the intensity distribution compensating process is reduced in the fourth specific example compared to the second specific example or the third example.

Note that the controller 21 may set different two types of arrangement patterns to two divided areas DA that are adjacent to each other along the X axis direction or the Y axis direction when the mirror element 141(0) and the mirror element 141(π) are alternately distributed along each of the X axis direction and the Y axis direction in the plurality of divided areas DA. The controller 21 may set different two types of arrangement patterns to two divided areas DA that are adjacent to each other along the X axis direction or along a direction intersecting with each of the X axis direction and the Y axis direction when the mirror element group including the plurality of mirror elements 141(0) sequentially arranged along the X axis direction and the mirror element group including the plurality of mirror elements 141(π) sequentially arranged along the X axis direction are alternately distributed along the Y axis direction. The controller 21 may set different two types of arrangement patterns to two divided areas DA that are adjacent to each other along the Y axis direction or along a direction intersecting with each of the X axis direction and the Y axis direction when the mirror element group including the plurality of mirror elements 141(0) sequentially arranged along the Y axis direction and the mirror element group including the plurality of mirror elements 141(π) sequentially arranged along the Y axis direction are alternately distributed along the X axis direction.

Incidentally, in the fourth specific example, it can be said that the plurality of mirror elements 141 disposed in a first area (for example, the divided area DA #31) are set so that the mirror element 141(0) in the first state (the 0 state) and the mirror element 141(π) in the second state (π state) are arranged on the basis of a first rule (for example, the basic pattern #2) and the plurality of mirror elements 141 disposed in a second area (for example, the divided area DA #32) are set so that the mirror element 141(0) in the first state (the 0 state) and the mirror element 141(π) in the second state (π state) are arranged on the basis of a second rule (for example, the basic pattern #1). In this case, when an area in which the mirror element 141(0) in the first state (the 0 state) and the mirror element 141(π) in the second state (π state) are arranged on the basis of the first rule is expanded to include the second area, the state of the mirror elements 141 in the area including the second area (the divided area DA #32) and the state of the mirror elements 141 in the second area (the divided area DA #32) may be different from each other.

In the fourth specific example, diffracted light from the plurality of mirror elements 141 that are arranged on the basis of the first rule and that are disposed in the first area (for example, the divided area DA #31) and diffracted light from the plurality of mirror elements 141 that are arranged on the basis of the second rule and that are disposed in the second area (for example, the divided area DA #32) causes an interference (for example, a destructive interference) to weaken each other at an incident pupil surface of the projection optical system 15, and the intensities of these diffracted light are decreased, and as a result, the entrance amount R of the 0/1 checker pattern light in the pupil is reduced. In other words, it can be said that the first rule in the first area and the second rule in the second rule are determined so that the 0/1 checker pattern lights that enter the incident pupil surface of the projection optical system 15 from the first and second areas have different phases.

In the fourth specific example, it can be said that states (the first state (the 0 state) and the second state (the π state)) of mirror elements 141-31a and 141-31b in a first group among the plurality of optical elements 141 are set to have a cyclicity in a cyclic direction (for example, the X direction) and states (the first state (the 0 state) and the second state (the π state)) of mirror elements 141-32a and 141-32b in a second group among the plurality of optical elements 141 are set to have a cyclicity in the cyclic direction. In this case, a cycle of the plurality of mirror elements 141-31a and 141-31b in the first group and a cycle of the plurality of mirror elements 141-32a and 141-32b in the second group may have different phases in the cyclic direction. Here, a condition where the phases of the cycles of the states of the plurality of mirror elements 141 may mean a condition where phases of square waves are different from each other when the distribution of the plurality of mirror elements 141 are represented by the square wave in which a vertical axis represents states of the plurality of mirror elements 141 that cyclically changed from the first state to the second state or from the second state to the first state and a horizontal axis represents a position of the mirror element 141. Moreover, the mirror elements 141-32a and 141-32b in the second group may be disposed at the cyclic direction (X axis direction) side from the mirror elements 141-31a and 141-31b in the first group. A plurality of rows of mirror elements may be disposed in the X direction between the mirror elements 141-31a and 141-31b in the first group and the mirror elements 141-32a and 141-32b in the second group, and each row may extend along the Y direction. Moreover, the mirror elements 141-31a and 141-31b in the first group and the mirror elements 141-32a and 141-32b in the second group may be adjacent to each other.

In the fourth specific example, it can be said that the two mirror elements 141-31a and 141-31b among the plurality of mirror elements 141 are set so that the mirror element 141-31a in the first state (the 0 state) and the mirror element 141-31b in the second state (the π state) are arranged along the X direction and the two mirror elements 141-32a and 141-32b that are different from the two mirror elements 141-31a and 141-31b among the plurality of mirror elements 141 are set to be arranged along the X direction. In this case, an even number of rows of mirror elements 141 may be disposed between the mirror elements 141-31a and 141-31b and the different mirror elements 141-32a and 141-32b. In this case, each row of the mirror elements 141 may extend along the Y direction and the number of rows of the mirror elements may be even number in the X direction. Incidentally, in this case, the two mirror elements and the different two mirror elements may be adjacent to each other. Here, the two mirror elements 141 and the different two mirror elements 141 may be adjacent to each other in the X direction.

In the fourth specific example, it can be said that the first mirror element 141-31a among the plurality of mirror elements 141 is set to be in the first state (0 state), the second mirror element 141-31b that is adjacent to the X direction side of the first mirror element 141-31b among the plurality of mirror elements 141 is set to be in the second state (π state), the third mirror element 141-32a among the plurality of mirror elements 141 is set to be in the second state (π state) and the fourth mirror element 141-32b that is adjacent to the X direction side of the third mirror element 141-32b among the plurality of mirror elements 141 is set to be in the first state (0 state). In this case, an odd number of mirror elements 141 may be disposed in the X direction or the Y direction between the first mirror element 141-31a and the third mirror element 141-32a. Moreover, a position of the first mirror element 141-31a may be same as a position of the third mirror element 141-32a in the X direction or in the Y direction.

Moreover, the controller 21 may apply "a rule of setting the arrangement pattern to the plurality of divided areas DA" used in the fourth specific example to the second or third specific example. Namely, in the second or third specific example, the controller 21 may set the appropriate arrangement pattern to each divided area DA on the basis of the states of the mirror elements 141 in the plurality of divided areas DA and the arrangement manner of the plurality of divided areas DA in setting the arrangement pattern to each divided area DA so that the entrance amount R of the 0/1 checker pattern light in the pupil is minimized.

However, there is a possibility that the entrance amount R of the 0/1 checker pattern light in the pupil is not minimized (alternatively, is not equal to or smaller than the first predetermined amount) only by setting the arrangement pattern to each divided area DA on the basis of the states of the mirror elements 141 in the plurality of divided areas DA and the arrangement manner of the plurality of divided areas DA. In this case, the controller 21 may change the arrangement pattern set to each divided area DA so that the entrance amount R of the 0/1 checker pattern light in the pupil is minimized. Alternatively, the controller 21 may divide (namely, segmentalize) each divided area DA into smaller divided areas DA. Next, with reference to FIG. 15A to FIG. 17B, an example in which each divided area DA is divided into smaller divided areas DA.

FIG. 15A illustrates an example in which four divided areas DA #51 to DA #54 in which the mirror element 141(0) and the mirror element 141(π) are alternately distributed along each of the X axis direction and the Y axis direction are adjacent in a 2×2 matrix manner. These four divided areas DA #51 to DA #54 may exists in an area in which the mirror elements 141 controlled to form adjacent four contact holes are disposed, for example. Moreover, FIG. 15B illustrates the intensity distribution of the exposure light EL3 via these four divided areas DA #51 to DA #54. As illustrated in FIG. 15B, it turns out that the intensity distribution of the exposure light EL3 is distorted.

In the four divided areas DA #51 to DA #54, the mirror element 141(0) and the mirror element 141(π) are alternately distributed along each of the X axis direction and the Y axis direction. Thus, the controller 21 sets arrangement patterns that are inverted from each other to the two divided areas DA #51 and DA #54, respectively, so that the arrangement pattern set to the divided area DA #54 is an arrangement pattern that is obtained by inverting the arrangement pattern set to the divided area DA #51 that is adjacent to the divided area DA #54 along a direction intersecting with each of the X axis direction and the Y axis direction, as illustrated in FIG. 16A. Similarly, the controller 21 sets arrangement patterns that are inverted from each other to the two divided areas DA #52 and DA #53, respectively, so that the arrangement pattern set to the divided area DA #53 is an arrangement pattern that is obtained by inverting the arrangement pattern set to the divided area DA #52 that is adjacent to the divided area DA #53 along a direction intersecting with each of the X axis direction and the Y axis direction, as illustrated in FIG. 16A. However, as illustrated in FIG. 16B, it turns out that the intensity distribution of the exposure light EL3 via these four divided areas DA #51 to DA #54 is still distorted. Namely, there is a possibility that the entrance amount R of the 0/1 checker pattern light in the pupil is not minimized.

Figure 17A:
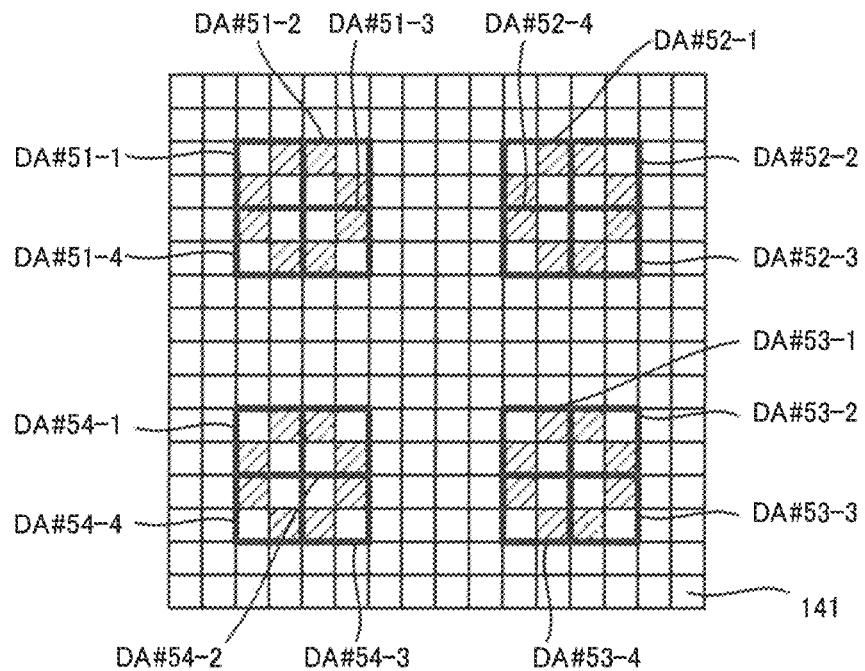
FIG. 17A is a planar view that illustrates sixteen divided areas that are obtained by further dividing each of the four divided areas illustrated in FIG. 16A
Figure 17B:
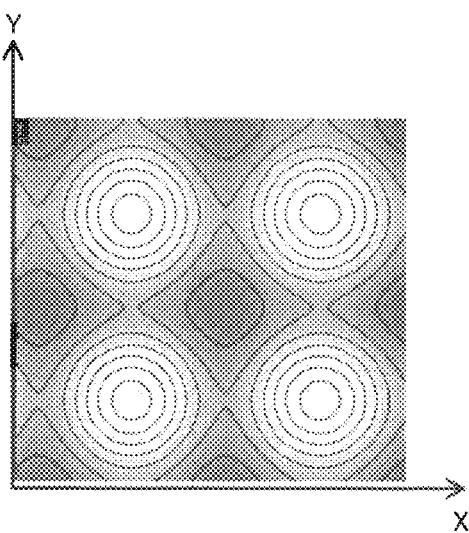
FIG. 17B is a graph that illustrates the intensity distribution of the exposure light via the sixteen divided areas illustrated in FIG. 17A.

Thus, as illustrated in FIG. 17A, the controller 21 divides the divided area DA #51 into smaller four divided areas DA #51-1 to DA #51-4. The controller 21 also divides each of the other divided areas DA #52 to DA #54 into smaller four divided areas DA. Then, the controller 21 sets the arrangement pattern to each of 4×4=16 divided areas DA. Even in this case, the controller 21 may set the arrangement pattern to each of the 16 divided areas DA by using the "rule of setting the arrangement pattern to the plurality of divided areas DA" used in the fourth specific example. Alternatively, the controller 21 may set the arrangement pattern to each of the 16 divided areas DA without using the "rule of setting the arrangement pattern to the plurality of divided areas DA". Note that FIG. 17A illustrates an example in which the arrangement pattern is set to each of the 16 divided areas DA without using the "rule of setting the arrangement pattern to the plurality of divided areas DA" used in the fourth specific example. As a result, the entrance amount R of the 0/1 checker pattern light in the pupil is minimized. Thus, as illustrated in FIG. 17B, the distortion of the intensity distribution of the exposure light EL3 via these 16 divided areas DA #51-1 to DA #54-4 is also minimized. Note that the distortion of the intensity distribution of the exposure light EL3 may be an amount of a deformation from an intensity distribution in an ideal state. The intensity distribution in the ideal state may be a distribution in which the intensity is maximized in an area obtained by geometrically reducing or enlarging each of the divided areas DA #51 to DA #54 by the magnification of the projection optical system 15 and the intensity is zero in the other area.

Figure 18A:
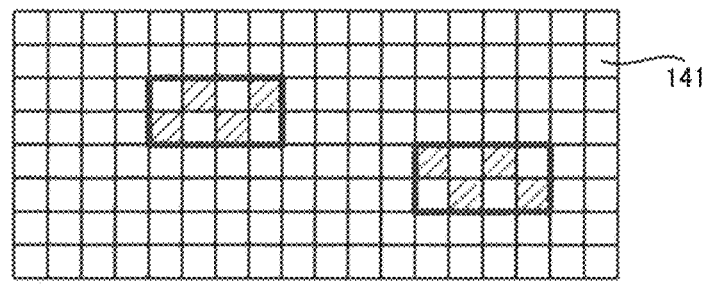
FIG. 18 Each of FIG. 18A to FIG. 18C is a planar view that illustrates four divided areas in which different arrangement patterns are set to two divided areas.
Figure 18B:
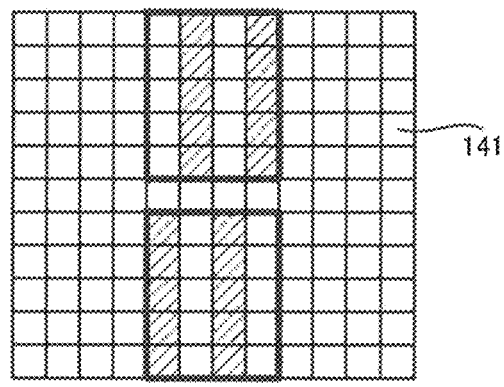
Figure 18C:
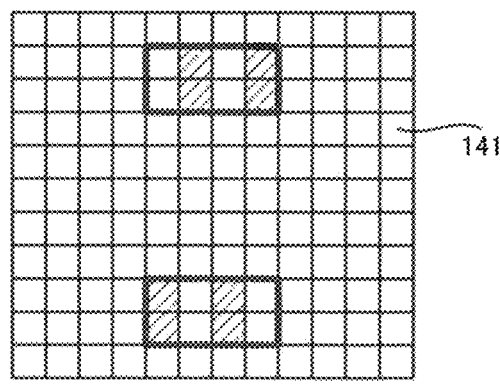

Note that the arrangement pattern illustrated in FIG. 18A to FIG. 18C may be used in the fourth specific example.

Note that the structure and the operation of the exposure apparatus 1 and the pattern design apparatus 2 described by using FIG. 1 to FIG. 18C is one example. Therefore, at least one portion of the structure and the operation of the exposure apparatus 1 and the pattern design apparatus 2 may be properly modified. Next, one example of the modification of at least one portion of the structure and the operation of the exposure apparatus 1 and the pattern design apparatus 2 will be described.

In the above described description, the spatial light modulator 14 is the reflective type of spatial light modulator. However, the spatial light modulator 14 may be a transmission type of spatial light modulator having a plurality of optical elements (for example, a plurality of transmission pixels including a liquid crystal element and the like) through each of which the exposure light EL passes. Here, when the spatial light modulator 14 is the transmission type of spatial light modulator, the plurality of transmission pixels may control at least one of a light amount, a phase and a polarization of the light that passes through the transmission pixels. Moreover, although the light modulation surface 14a of the spatial light modulator 14 has the rectangular shape in the above described description, not only the rectangular shape but also any shape such as a polygonal shape (a trapezoidal shape, a parallelogram shape, a hexagonal shape and the like), a circular shape, an oval shape and a long round shape may be used. Moreover, although the plurality of mirror elements 141 of the spatial light modulator 14 have the square shape in the above described description, not only the square shape but also any shape such as a polygonal shape (a trapezoidal shape, a parallelogram shape, a hexagonal shape and the like), a circular shape, an oval shape and a long round shape may be used.

In the above described description, the exposure apparatus 1 is a dry-type of exposure apparatus that exposes the wafer 161 not through liquid. However, the exposure apparatus 1 may be a liquid immersion exposure apparatus that forms a liquid immersion space including a light path of the exposure light EL3 between the projection optical system 15 and the wafer 161 and exposes the wafer 161 through the projection optical system 15 and the liquid immersion space. Note that one example of the liquid immersion exposure apparatus is disclosed in EP1420298A2, WO2004/055803A1, US6,952,253B and so on, for example.

The exposure apparatus 1 may be a twin stage type or a multi stage type of exposure apparatus that includes a plurality of stages 16. The exposure apparatus 1 may be a twin stage type or a multi stage type of exposure apparatus that includes a plurality of stages 16 and a measurement stage. One example of the twin stage type or the multi stage type of exposure apparatus is disclosed in U.S. Pat. No. 6,341,007B, 6,208,407B and 6,262,796B that are incorporated in the disclosures of the present application by reference, for example.

The optical source 11 may emit, as the exposure light EL1, any light that is different from the ArF excimer laser light having the wavelength of 193 nm. For example, the optical source 11 may emit deep-ultraviolet light (DUV light) such as KrF excimer laser light having a wavelength of 248 nm. The optical source 11 may emit vacuum-ultraviolet light (VUV light) such as $F_2$ laser light having a wavelength of 157 nm. The optical source 11 may emit any laser light or any light having a desired wavelength (for example, a bright line emitted from mercury lamp, and g-line, h-line, i-line or the like, for example)). The optical source 11 may emit harmonic that is generated by amplifying a single-wavelength laser light in an infrared range or a visible range oscillated from a DFB semiconductor laser or a fiber laser by a fiber amplifier in which erbium (alternatively, both of erbium and yttrium) is doped and wavelength-converting it to ultraviolet light by using a non-linear optical crystal, as disclosed in US7,023,610B. The optical source 11 may emit not only the light having the wavelength of 100 nm or more but also the light having the wavelength less than 100 nm. For example, the optical source 11 may emit EUV (Extreme Ultra Violet) light in a soft X-ray range (for example, a wavelength range from 5 to 15 nm). The exposure apparatus 1 may have an electron beam source that emits electron beam used as the exposure light EL1, in addition to or instead of the light source 11. The exposure apparatus 1 may have a solid pulse laser optical source that generates harmonic of laser light outputted from a YAG laser or a solid laser (semiconductor laser and the like), in addition to or instead of the light source 11. The solid pulse laser optical source is allowed to emit the pulse light that has the pulse width of 1ns and the wavelength of 193 nm (other wavelength such as 213 nm, 266 nm, 355 nm, for example, may be used) and that is used as the exposure light EL1 in a frequency from 1 to 2 MHz. The exposure apparatus 1 may have a beam source that emits any energy beam that is used as the exposure light EL1, in addition to or instead of the light source 11.

Moreover, a polarized illumination method disclosed in US2006/0170901A1 and US2007/0146676A1 may be used in the above described description.

An object to which the device pattern is transferred is not limited to the wafer 161 and may be any object such as a glass plate, a ceramic substrate, a film member and a mask blanks. The exposure apparatus 1 may be an exposure apparatus for manufacturing a semiconductor element that exposes a semiconductor element pattern on the wafer 161. The exposure apparatus may be an exposure apparatus for manufacturing a liquid crystal display element or a display. The exposure apparatus 1 may be an exposure apparatus for manufacturing at least one of a thin film magnetic head, an imaging element (for example, a CCD), a micro machine, a MEMS, a DNA chip and a mask or a reticle that is used for a photolithography.

Figure 19:
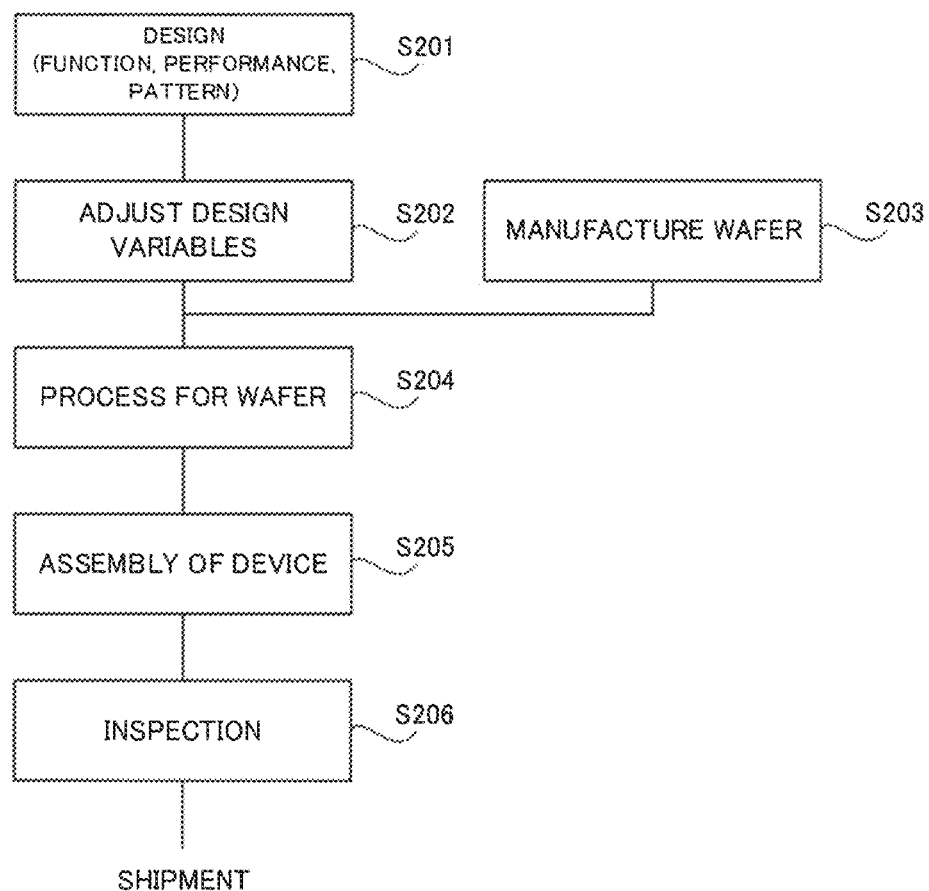
FIG. 19 is a flowchart that illustrates a method of manufacturing a microdevice.

A micro device such as the semiconductor device or the like may be manufactured through each step illustrated in FIG. 19. Steps for manufacturing the semiconductor device may include a step S201 at which function and performance of the micro device is designed, a step S202 at which the design variables are adjusted on the basis of the designed function and performance (see the above described FIG. 5), a step S203 at which the wafer 161 that is the base material of the device is manufactured, a step S204 at which the wafer 161 is exposed by the exposure light EL3 obtained by the spatial light modulator 14 reflecting the exposure light EL2 and the exposed wafer 161 is developed, a step S205 including a device assembling process (a manufacturing process including a dicing process, a bonding process, a packaging process and the like) and an inspection step S206.

At least one portion of the aspect of each embodiment described above may be appropriately combined with at least another one portion of the aspect of each embodiment described above. One portion of the aspect of each embodiment described above may not be used. Moreover, the disclosures of all publications and United States patents that are cited in each embodiment described above and that relates to the exposure apparatus are incorporated in the disclosures of the present application by reference if it is legally permitted.

The present invention can be changed, if desired, without departing from the essence or spirit of the invention which can be read from the claims and the entire specification. A control apparatus and a control method, an exposure apparatus and an exposure method, a device manufacturing method, a data generating method and a program, which involve such changes, are also intended to be within the technical scope of the present invention.

DESCRIPTION OF REFERENCE CODES 1 exposure apparatus
11 optical source
12 illumination optical system
14 spatial light modulator
14a light modulation surface
141 mirror element
15 projection optical system
16 stage
161 wafer
17 controller
2 pattern design apparatus
21 CPU
22 memory
EL1, EL2, EL3 exposure light

The invention claimed is:

1. A control apparatus that is configured to control a spatial light modulator, the spatial light modulator being used for an exposure apparatus having a projection optical system for projecting a pattern image on an object and having a plurality of optical elements a state of each of which is allowed to be changed,
the control apparatus being configured to set states of a plurality of optical elements located in a first area to a first distribution in which a first optical element in a first state and a second optical element in a second state that is different from the first state are distributed in a first distribution pattern so that one portion of a light from the plurality of optical elements located in the first area enters the projection optical system, and
the control apparatus being configured to set states of a plurality of optical elements located in a second area that is adjacent to the first area to a second distribution in which the first optical element and the second optical element are distributed in a second distribution pattern that is different from the first distribution pattern so that a deterioration of the pattern image caused by a light that enters the projection optical system from the first area is reduced,
wherein each of the first and second distribution patterns is a distribution pattern in which the first and second optical elements are alternately distributed along a first direction and a second direction that intersects with the first direction.

2. The control apparatus according to claim 1, wherein the second distribution pattern is a distribution pattern obtained by inverting the first distribution pattern.

3. The control apparatus according to claim 1, wherein the second area is adjacent to the first area along a third direction that intersects with the first and second directions.

4. The control apparatus according to claim 1, wherein the second area is adjacent to the first area along the first or second direction.

5. The control apparatus according to claim 1, wherein each the first and second distribution patterns is a distribution pattern in which a first element group including a plurality of first optical elements that line along a fourth direction and a second element group including a plurality of second optical elements that line along the fourth direction are alternately distributed along a fifth direction that intersects with the fourth direction,
the second area is adjacent to the first area along the fifth direction.

6. The control apparatus according to claim 1 being configured to divide a predetermined area on a light modulation surface of the spatial light modulator into a plurality of divided areas and to set states of a plurality of optical element located in each of the plurality of divided areas.

7. The control apparatus according to claim 6, wherein the predetermined area includes an area in which the first and second optical elements are alternately distributed along a sixth direction and a seventh direction that intersects with the sixth direction.

8. The control apparatus according to claim 6, wherein the predetermined area includes an area in which a third element group including a plurality of first optical elements that line along a eighth direction and a fourth element group including a plurality of second optical elements that line along the eighth direction are alternately distributed along a ninth direction that intersects with the eighth direction.

9. The control apparatus according to claim 6 being configured to repeat an operation of dividing the predetermined area into the plurality of divided areas and decreasing a size of the divided area.

10. The control apparatus according to claim 1 being configured to divide a predetermined area on a light modulation surface of the spatial light modulator into a plurality of divided areas, to set one divided area of the plurality of divided areas to the first area and to set another divided area of the plurality of divided areas to the second area.

11. The control apparatus according to claim 1 being configured to set the states of the plurality of optical elements to reduce an influence on a projection of the pattern image by a light propagating from the spatial light modulator toward an outside of a pupil of the projection optical system.

12. The control apparatus according to claim 11 being configured to set the states of the plurality of optical elements to satisfy an Equation 1,
wherein a position in a Fourier space is represented by a coordinate ($\zeta$, $\eta$), a size of each of the plurality of optical elements in a real space is represented by p, a spectrum of a light via a plurality of optical elements in which the first or second optical element and a virtual third optical element that does not reflect the light are alternately distributed along each of a tenth direction and a eleventh direction that intersects with the tenth direction at a coordinate (m, n) outside the pupil in the Fourier space is represented by $a_{mn}$, a wavelength of the light is represented by $\lambda$, and a spectrum of a spatial image that should be realized at the coordinate ($\zeta$, $\eta$) to transfer the pattern image is represented by $T_{PATTERN}$ ($\zeta$, $\eta$).

$$\min_{mask} \sum_{(\xi,\eta)\in pupil} \sum_{m,n\neq 0} \left|2a_{mn}T_{PATTERN}\left(\xi-\frac{m\lambda}{2p}, \eta-\frac{n\lambda}{2p}\right)\right|. \quad \text{[Equation 1]}$$

13. The control apparatus according to claim 11 being configured to
divide a predetermined area on a light modulation surface of the spatial light modulator into a plurality of divided areas, and
set the states of the optical elements located in the plurality of divided areas to satisfy an Equation 2,
wherein a position in a Fourier space is represented by a coordinate ($\zeta$, $\eta$), a total number of the plurality of divided areas is represented by N, a spectrum of a light via an i-th (note that i is an integer that satisfies $1 \leq i \leq N$) divided area at a coordinate ($\zeta$, $\eta$) is represented by $T_{CHECKER}^{(i)}(\zeta, \eta)$, and a function a value including a sign of which varies depending on the state of the optical element located in the i-th divided area is represented by sign(i).

$$\min_{sign} \sum_{(\xi,\eta)\in pupil} \left|\sum_{i=i} \text{sign}(i) \times T_{CHECKER}^{(i)}(\xi, \eta)\right|. \quad \text{[Equation 2]}$$

14. The control apparatus according to claim 13 being configured to set the states of a plurality of optical elements located in each of the plurality of divided areas to a state corresponding to one candidate selected from a plurality of candidates prepared in advance to satisfy the Equation 2.

15. The control apparatus according to claim 14 being configured to set the states of a plurality of optical elements located in each of the plurality of divided areas to a state corresponding to one candidate selected from a plurality of candidates prepared in advance to satisfy the Equation 3.

16. The control apparatus according to claim 13, wherein sizes of the plurality of divided areas are same as each other,
the control apparatus being configured to set the states of the optical elements located in the plurality of divided areas to satisfy an Equation 3,
wherein a vector indicating the coordinate (ζ, η) is represented by 1, a vector specifying a coordinate of the i-th divided area in a real space is represented by $r_i$, a spectrum of a light from innumerable virtual optical elements in which the first and second optical elements are alternately distributed along each of a twelfth direction and a thirteenth direction that intersects with the twelfth direction at the coordinate (ζ, η) is represented by I (vector 1) and a complex number is represented by j,
a jinc function in the equation 3 is defined by an equation 4, A in the equation 4 represents a size of the divided area along the twelfth direction in a real space, $A_y$ in the equation 4 represents a size of the divided area along the thirteenth direction in a real space and k in the equation 4 is a coefficient.

$$\min_{sign} \sum_{\vec{l} \in pupil} \left| [\vec{I}(\vec{l}) * jinc(\vec{l})] \sum_{i=1}^{N} \text{sign}(i) \times \exp(-j\vec{l} \times \vec{r_i}) \right| \quad \text{[Equation 3]}$$

$$jinc(\vec{l}) = \Delta_x \Delta_y \text{Sinc}\left(k\xi\frac{\Delta_x}{2}\right)\text{Sinc}\left(k\eta\frac{\Delta_y}{2}\right). \quad \text{[Equation 4]}$$

17. The control apparatus according to claim 1, wherein the control apparatus is configured to set the states of the plurality of optical elements to reduce an influence on a projection of the pattern image by a light propagating from the spatial light modulator toward an outside of a pupil of the projection optical system.

18. An exposure apparatus comprising:
a spatial light modulator; and
the control apparatus according to claim 17 for controlling the spatial light modulator.

19. The control apparatus according to claim 11 being configured to set the states of the plurality of optical elements to reduce a light component of the light that should propagate from the spatial light modulator toward the outside of the pupil of the projection optical system, the light component reaching within the pupil of the projection optical system.

20. An exposure apparatus comprising:
a spatial light modulator; and
the control apparatus according to claim 1 for controlling the spatial light modulator.

21. A control apparatus that is configured to control a spatial light modulator, the spatial light modulator being used for an exposure apparatus configured to transfer a pattern on an object and having a plurality of optical elements a state of each of which is allowed to be changed,
the control apparatus being configured to set states of a plurality of optical elements located in a first area to a first distribution in which a first optical element in a first state and a second optical element in a second state that is different from the first state are distributed in a first distribution pattern, and
the control apparatus being configured to set states of a plurality of optical elements located in a second area that is adjacent to the first area to a second distribution in which the first optical element and the second optical element are distributed in a second distribution pattern that is different from the first distribution pattern,
wherein each of the first and second distribution patterns is a distribution pattern in which the first and second optical elements are alternately distributed along a first direction and a second direction that intersects with the first direction.

22. An exposure apparatus comprising:
a spatial light modulator; and
the control apparatus according to claim 21 for controlling the spatial light modulator.

23. A control apparatus that is configured to control a spatial light modulator having a plurality of optical elements a state of each of which is allowed to be changed,
the control apparatus being configured to set (i) states of a plurality of optical elements located in a first area on the spatial light modulator to a first distribution, in which a first optical element in a first state and a second optical element in a second state that is different from the first state are distributed in a first distribution pattern, and (ii) states of a plurality of optical elements located in a second area that is different from the first area on the spatial light modulator to a second distribution, in which the first optical element and the second optical element are distributed in a second distribution pattern that is different from the first distribution pattern, so that a first diffracted light generated from the first area and a second diffracted light generated from the second area weaken each other by interference,
wherein each of the first and second distribution patterns is a distribution pattern in which the first and second optical elements are alternately distributed along a first direction and a second direction that intersects with the first direction.

24. An exposure apparatus comprising:
a spatial light modulator; and
the control apparatus according to claim 23 for controlling the spatial light modulator.

25. A control apparatus that is configured to control a spatial light modulator having a plurality of optical elements a state of each of which is allowed to be changed and that are arranged in a first direction and a second direction that intersects with the first direction,
the control apparatus being configured to set a plurality of optical elements located in a first area among the plurality of optical elements of the spatial light modulator so that an optical element in a first state and an optical element in a second state that is different from the first state are arranged on the basis of a first rule,
the control apparatus being configured to set a plurality of optical elements located in a second area that is different from the first area among the plurality of optical elements of the spatial light modulator so that the optical element in the first state and the optical element in the second state are arranged on the basis of a second rule that is different from the first rule,
when an area in which the optical elements in the first and second states are arranged on the basis of the first rule is expanded to include the second area, the state of an optical element in the area including the second area and the state of an optical element in the second area are different from each other.

26. An exposure apparatus comprising:
a spatial light modulator; and
the control apparatus according to claim 25 for controlling the spatial light modulator.

27. A control apparatus that is configured to control a spatial light modulator having a plurality of optical elements a state of each of which is allowed to be changed between a first state and a second state and that are arranged along an arrangement plane,
the control apparatus being configured to set states of optical elements in a first group among the plurality of optical elements to have a cyclicity in a cyclic direction, the states of the optical elements in the first group being set to a first distribution in which a first optical element in the first state and a second optical element in the second state that is different from the first state are distributed in a first distribution pattern,
the control apparatus being configured to set states of optical elements in a second group that is different from the first group among the plurality of optical elements to have a cyclicity in the cyclic direction, the states of the optical elements in the second group being set to a second distribution in which the first optical element and the second optical element are distributed in a second distribution pattern that is different from the first distribution pattern, and
a cycle of the plurality of optical elements in the first group and a cycle of the plurality of optical elements in the second group having different phases in the cyclic direction,
wherein each of the first and second distribution patterns is a distribution pattern in which the first and second optical elements are alternately distributed along a first direction and a second direction that intersects with the first direction.

28. The control apparatus according to claim 27, wherein the plurality of optical elements area arranged along each of a first direction and a second direction that intersects with the first direction,
the cyclic direction is the first or second direction.

29. The control apparatus according to claim 27, wherein the optical elements in the first group include a first optical element that is set to the first state and a second optical element that is disposed at the cyclic direction side from the first optical element and that is set to the second state,
the optical elements in the second group include a third optical element that is set to the second state and a fourth optical element that is disposed at the cyclic direction side from the third optical element and that is set to the first state.

30. The control apparatus according to claim 29, wherein the optical element in the first group and the optical element in the second group are adjacent to each other.

31. The control apparatus according to claim 29, wherein an even number of rows of optical elements each of which extends in the first direction are disposed along the second direction between the optical elements in the first group and the optical elements in the second group.

32. The control apparatus according to claim 27, wherein the optical element that is set to the first state emits a light having a first phase,
the optical element that is set to the second state emits a light having a second phase that is different from the first phase.

33. The control apparatus according to claim 27, wherein the optical elements in the first group diffract a light entering the optical elements in the first group,
the optical elements in the second group diffract a light entering the optical elements in the second group.

34. The control apparatus according to claim 33, wherein the light diffracted by the optical elements in the first group has a different phase from that of the light diffracted by the optical elements in the second group.

35. The control apparatus according to claim 34 being used with a projection optical system for projecting a light from the spatial light modulator on an image plane,
the light diffracted by the optical elements in the first group intersecting with the light diffracted by the optical elements in the second group in the projection optical system.

36. The control apparatus according to claim 35, wherein the light diffracted by the optical elements in the first group and the light diffracted by the optical elements in the second group that intersect with each other in the projection optical system interfere to weaken each other.

37. An exposure apparatus comprising:
a spatial light modulator; and
the control apparatus according to claim 27 for controlling the spatial light modulator.

38. A control apparatus that is configured to control a spatial light modulator having a plurality of optical elements a state of each of which is allowed to be changed and that are arranged in a first direction and a second direction that intersects with the first direction,
the control apparatus being configured to set states of two optical elements among the plurality of optical elements so that an optical element in a first state and an optical element in a second state that is different from the first state line along a third direction,
the control apparatus being configured to set states of different two optical elements that are different from the two optical elements among the plurality of optical elements so that the optical element in the second state and the optical element in the first state line along the third direction,
the two optical elements being adjacent to the different two optical elements or an even number of rows of the optical elements being disposed between the two optical elements and the different two optical elements.

39. The control apparatus according to claim 38, wherein the third direction is a direction same as the first direction or the second direction.

40. The control apparatus according to claim 38, wherein the two optical elements and the different two optical elements are arranged along the third direction.

41. The control apparatus according to claim 40, wherein the two optical elements and the different two optical elements are adjacent to each other in the third direction.

42. The control apparatus according to claim 38, wherein an even number of rows each of which extends in the first direction are disposed along the second direction between the two optical elements and the different two optical elements.

43. The control apparatus according to claim 38, wherein the optical element that is set to the first state emits a light having a first phase,
the optical element that is set to the second state emits a light having a second phase that is different from the first phase.

44. The control apparatus according to claim 38, wherein
the two optical elements diffract a light entering the two optical elements,
the different two optical elements diffract a light entering the different two optical elements.

45. The control apparatus according to claim 44, wherein
the light diffracted by the two optical elements has a different phase from that of the light diffracted by the different two optical elements.

46. The control apparatus according to claim 45 being used with a projection optical system for projecting a light from the spatial light modulator on an image plane,
the light diffracted by the two optical elements intersecting with the light diffracted by the different two optical elements in the projection optical system.

47. The control apparatus according to claim 46, wherein
the light diffracted by the two optical elements and the light diffracted by the different two optical elements that intersect with each other in the projection optical system interfere to weaken each other.

48. A control apparatus that is configured to control a spatial light modulator having a plurality of optical elements a state of each of which is allowed to be changed and that are arranged in a first direction and a second direction that intersects with the first direction,
the control apparatus being configured to set a state of a first optical element among the plurality of optical elements to a first state,
the control apparatus being configured to set a state of a second optical element that is adjacent to a third direction side of the first optical element among the plurality of optical elements to a second state that is different from the first state,
the control apparatus being configured to set a state of a third optical element that is different from the first and second optical elements among the plurality of optical elements to the second state,
the control apparatus being configured to set a state of a fourth optical element that is adjacent to the third direction side of the third optical element among the plurality of optical elements to the first state,
the first optical element and the third optical element being in the same position in the first direction or an odd number of optical elements being disposed between the first optical element and the third optical element in the first direction.

49. The control apparatus according to claim 48, wherein
the third direction is a direction same as the first direction or the second direction.

50. The control apparatus according to claim 48, wherein
a plurality of rows each of which extends in the second direction are arranged along the first direction between the first optical element and the third optical element.

51. An exposure apparatus comprising:
a spatial light modulator; and
the control apparatus according to claim 50 for controlling the spatial light modulator.

52. The control apparatus according to claim 48, wherein
the first and fourth optical elements that are set to the first state emit lights having a first phase,
the second and third optical element that are set to the second state emit lights having a second phase that is different from the first phase.

53. The control apparatus according to claim 48, wherein
the first and second optical elements diffract a light entering the first and second optical elements,
the third and fourth optical elements diffract a light entering the third and fourth optical elements.

54. The control apparatus according to claim 53, wherein
the light diffracted by the first and second optical elements has a different phase from that of the light diffracted by the third and fourth optical elements.

55. The control apparatus according to claim 54 being used with a projection optical system for projecting a light from the spatial light modulator on an image plane,
the light diffracted by the first and second optical elements intersects with the light diffracted by the third and fourth optical elements in the projection optical system.

56. The control apparatus according to claim 55, wherein
the light diffracted by the first and second optical elements and the light diffracted by the three and fourth optical elements that intersect with each other in the projection optical system interfere to weaken each other.

* * * * *